(12) United States Patent
Kang et al.

(10) Patent No.: US 12,170,121 B2
(45) Date of Patent: Dec. 17, 2024

(54) SEMICONDUCTOR MEMORY DEVICE INCLUDING COMMAND LOG REGISTER AND COMMAND LOG OUTPUT METHOD THEREOF

(71) Applicant: SAMSUNG ELECTRONICS CO., LTD., Suwon-si (KR)

(72) Inventors: Youngsan Kang, Suwon-si (KR); Donghee Kim, Suwon-si (KR); Jungho Jung, Suwon-si (KR); Jun-Ho Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 273 days.

(21) Appl. No.: 17/949,000

(22) Filed: Sep. 20, 2022

(65) Prior Publication Data

US 2023/0335209 A1    Oct. 19, 2023

(30) Foreign Application Priority Data

Apr. 15, 2022 (KR) .................. 10-2022-0046929

(51) Int. Cl.
*G11C 29/00* (2006.01)
*G11C 29/12* (2006.01)
*G11C 29/36* (2006.01)

(52) U.S. Cl.
CPC .......... *G11C 29/36* (2013.01); *G11C 29/1201* (2013.01); *G11C 29/12015* (2013.01)

(58) Field of Classification Search
CPC .............. G11C 29/36; G11C 29/1201; G11C 29/12015

USPC ........................................ 365/201
See application file for complete search history.

(56) References Cited

U.S. PATENT DOCUMENTS

| | | | | |
|---|---|---|---|---|
| 6,438,055 | B1 * | 8/2002 | Taguchi | G11C 11/406 365/222 |
| 6,535,442 | B2 * | 3/2003 | Kumakura | G11C 29/00 365/201 |
| 7,251,192 | B2 * | 7/2007 | Walker | G11C 7/1072 369/47.48 |
| 7,870,441 | B2 | 1/2011 | Gollub et al. | |
| 8,411,496 | B2 | 4/2013 | Hong | |
| 8,649,238 | B2 * | 2/2014 | Kim | G11C 8/12 365/230.03 |

(Continued)

FOREIGN PATENT DOCUMENTS

JP          4790988 B2    10/2011
KR   10-0377904 B1    3/2003

(Continued)

*Primary Examiner* — Tha-O H Bui
(74) *Attorney, Agent, or Firm* — Sughrue Mion, PLLC

(57) ABSTRACT

A semiconductor memory device includes: a memory core including memory cells and configured to output core data stored in the memory cells in response to a read request, a command decoder configured to decode at least one command input from an external device, a command log register configured to sequentially store the at least one command in response to a register enable signal and output the at least one command as a command log in response to a command log read signal, and a mode register set configured to generate the register enable signal or the command log read signal in response to a mode register set command transmitted to the command decoder.

20 Claims, 21 Drawing Sheets

(56) References Cited

U.S. PATENT DOCUMENTS

| | | |
|---|---|---|
| 8,966,327 B1 | 2/2015 | Wang |
| 9,170,878 B2 | 10/2015 | Haywood et al. |
| 10,002,677 B2 | 6/2018 | Chae |
| 2007/0115744 A1 | 5/2007 | Walker |
| 2009/0240990 A1 | 9/2009 | Gollub et al. |
| 2012/0185656 A1 | 7/2012 | Hong |
| 2013/0262956 A1 | 10/2013 | Haywood et al. |
| 2016/0098390 A1 | 4/2016 | Kitajima et al. |
| 2017/0184673 A1 | 6/2017 | Chae |

FOREIGN PATENT DOCUMENTS

| | | |
|---|---|---|
| KR | 10-0620644 B1 | 9/2006 |
| KR | 10-0827658 B1 | 5/2008 |
| KR | 10-0844485 B1 | 7/2008 |
| KR | 10-0931024 B1 | 12/2009 |
| KR | 10-1190687 B1 | 10/2012 |
| KR | 10-2017-0076098 A | 7/2014 |
| KR | 10-2017-0108454 A | 9/2017 |
| KR | 10-1898176 B1 | 9/2018 |

\* cited by examiner

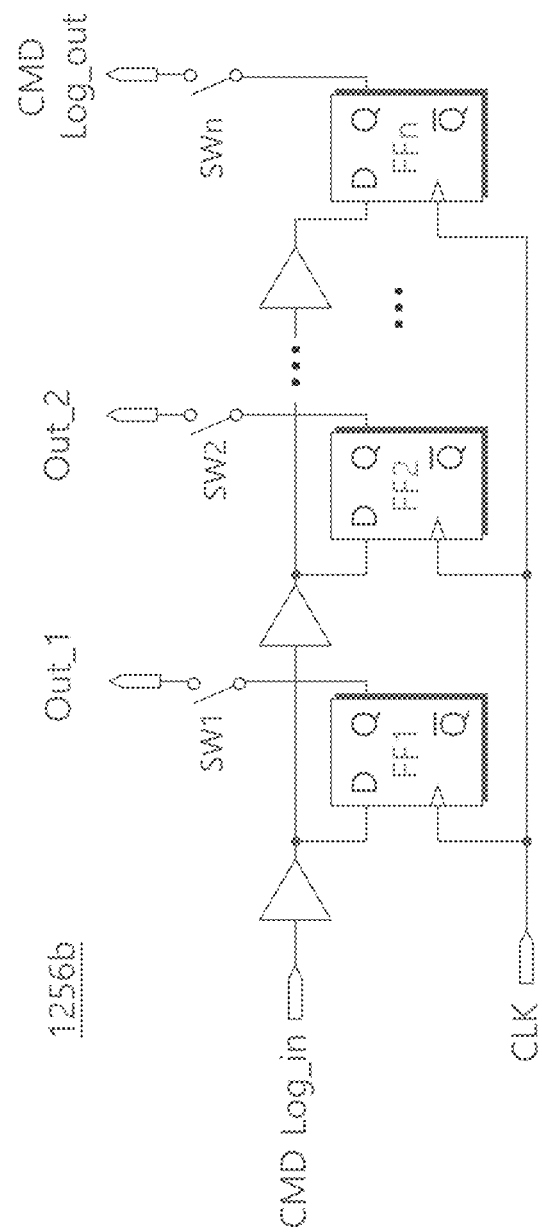

SEMICONDUCTOR MEMORY DEVICE INCLUDING COMMAND LOG REGISTER AND COMMAND LOG OUTPUT METHOD THEREOF

CROSS-REFERENCE TO RELATED APPLICATION(S)

This application claims priority under 35 U.S.C. § 119 to Korean Patent Application No. 10-2022-0046929 filed on Apr. 15, 2022, in the Korean Intellectual Property Office, the disclosure of which is incorporated by reference herein in its entirety.

BACKGROUND

The present disclosure relates to a semiconductor memory device, and more particularly, to a semiconductor memory device including a command log register and a command log output method thereof.

In accordance with the demand for high performance and high capacity, the degree of integration and operation speed of semiconductor memory devices is rapidly increasing. As the operating speed of a semiconductor memory device increases, a system-in-package (SiP) type memory system in which a CPU or GPU and a semiconductor memory device are manufactured as one package is being used. The pad of the semiconductor memory device having the stacked structure or the structure packaged in the system tends not to be exposed to the outside. Accordingly, it is increasingly difficult to test such a memory device through probing.

For example, an interposer included in the system-in-package (SiP) generates relatively large distortion during probing of a high-speed semiconductor memory device. Therefore, it is difficult to accurately test or analyze an input/output signal of a semiconductor memory device using a logic timing analyzer that detects an input/output signal through probing. In addition, even if a probing environment for testing a semiconductor memory device in a system-in-package (SiP) is established, a test cost is increased due to a relatively high degree of difficulty. Accordingly, there is a need for a technique for debugging a high-speed semiconductor memory device or a semiconductor memory device in a system-in-package (SiP) with high accuracy and low cost.

SUMMARY

Provided are a semiconductor memory device capable of providing a low-cost and highly reliable debugging environment by providing an easy command history in a semiconductor device having difficulty analyzing logic timing, and a method for outputting a command log thereof.

According to an aspect of an embodiment, a semiconductor memory device includes: a memory core including memory cells and configured to output core data stored in the memory cells in response to a read request, a command decoder configured to decode at least one command input from an external device, a command log register configured to sequentially store the at least one command in response to a register enable signal and output the at least one command as a command log in response to a command log read signal, and a mode register set configured to generate the register enable signal or the command log read signal in response to a mode register set command transmitted to the command decoder.

According to an aspect of an embodiment, a semiconductor memory device comprising, a memory core comprising dynamic random access memory (DRAM) cells and configured to output core data stored in the DRAM cells in response to a read command, a command decoder configured to decode at least one command input from an external device, a command log register configured to sequentially store the at least one command in response to a register enable signal and output the stored at least one command as a command log in response to a command log read signal, a command gate configured to transfer the at least one command to the command log register in response to the register enable signal, a mode register set configured to generate the register enable signal in response to a mode register set command transmitted to the command decoder, and a data selector configured to select one of the core data and the command log in response to a selection signal and output the selected one to a data pin.

According to an aspect of an embodiment, a method for outputting a command log of a semiconductor memory device, includes storing at least one command input from an external device into a command log register of the semiconductor memory device, detecting a reset signal for initializing the semiconductor memory device, outputting the at least one command stored in the command log register as a command log in response to the reset signal, and initializing the semiconductor memory device after outputting the command log is completed.

BRIEF DESCRIPTION OF THE DRAWINGS

The above and other aspects of the present disclosure will become apparent by describing in detail embodiments thereof with reference to the accompanying drawings, in which:

FIGS. 7A, 7B, and 7C are circuit diagrams showing the variable delay line of FIG. 6 according to embodiments;

DETAILED DESCRIPTION

It is to be understood that both the foregoing general description and the following detailed description are exemplary. Reference signs are indicated in detail in embodiments, examples of which are indicated in the reference drawings. Wherever possible, the same reference numbers are used in the description and drawings to refer to the same or like parts.

Hereinafter, a DRAM will be used as an example of a semiconductor memory device for describing features and functions of embodiments. However, one skilled in the art will readily appreciate other advantages and capabilities of embodiments in accordance with the teachings herein. Embodiments may be implemented or applied in a number of ways. Moreover, the detailed description may be modified or changed according to the viewpoint and application without departing significantly from the scope, spirit and other objects of embodiments.

Figure 1:
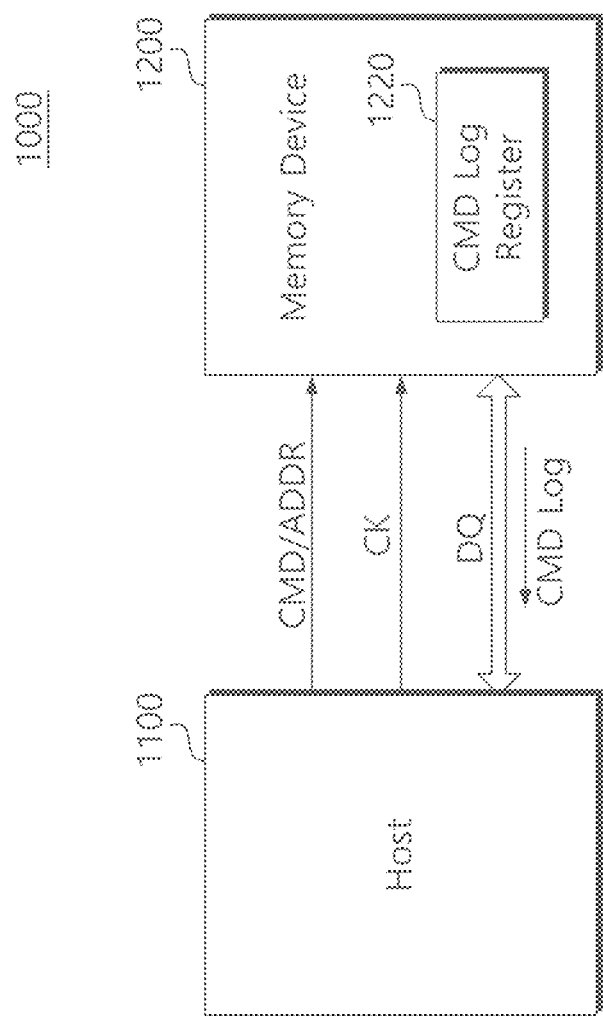
FIG. 1 is a block diagram illustrating a memory system including a memory device according to an embodiment.

FIG. 1 is a block diagram illustrating a memory system including a memory device according to an embodiment. Referring to FIG. 1, a memory system 1000 may include a host 1100 and a memory device 1200.

The host 1100 may perform an access operation for writing data to the memory device 1200 or reading data stored in the memory device 1200. The host 1100 may generate a command CMD and an address ADDR for writing data to the memory device 1200 or reading data stored in the memory device 1200. The host 1100 may be at least one of a memory controller for controlling the memory device 1200, a system-on-chip (SoC) such as an application processor (AP), a CPU, and a GPU.

Alternatively, the host 1100 may be a test device or a debugging device for testing the memory device 1200. In this case, the host 1100 may provide the memory device 1200 with a command CMD for outputting a log of commands ("CMD Log") received by the memory device 1200. For example, the host 1100 controls activation and input/output of the command log register 1220 of the memory device 1200 using a mode register set (MRS) or test mode register set (TMRS) command.

The host 1100 may detect a failure or error of the memory device 1200 by referring to a command log CMD Log output from the command log register 1220. The command log CMD Log means a history of commands input by the host 1100. The host 1100 may detect and analyze a command-related failure based on a command log CMD Log from the memory device 1200. For example, when a request provided by the host 1100 is invalid or a problem occurs in an internal operation of the memory device 1200 related to the request, command execution may fail. In this case, the host 1100 may collect a command log CMD Log stored in the command log register 1220 of the memory device 1200 to check the command history. The host 1100 may identify, through the command history, which commands have been previously issued and which commands have failed to execute or which commends may affect the execution of the failed command.

The memory device 1200 outputs read data to the host 1100 requested by the host 1100 or stores data requested to be written by the host 1100 in a memory cell. In particular, the memory device 1200 stores commands CMD provided from the host 1100 under the control of the host 1100 in the command log register 1220. The memory device 1200 may output the command log stored in the command log register 1220 through the data path DQ according to the request of the host 1100. Alternatively, when a reset signal/RESET from the host 1100 is input, the memory device 1200 may control the command log register 1220 and input/output circuits to automatically output a command log CMD Log to the host 1100. The memory device 1200 may adjust the latency (hereinafter, log latency) when outputting the command log to be the same as the latency (hereinafter, log latency) when outputting data stored in the memory cell (hereinafter, read latency).

Here, the memory device 1200 may be a high-bandwidth memory (HBM) or a next-generation DRAM (e.g., LPDDR6 or LPDDR7) operating at ultra-speed. In particular, the memory device 1200 may be a semiconductor memory device in a system-in-package (SiP) in which it is difficult to construct an interposer for building a test environment. Alternatively, the memory device 1200 may be a volatile memory device such as DDR SDRAM (Double Data Rate Synchronous Dynamic Random Access Memory), LPDDR (Low Power Double Data Rate) SDRAM, GDDR (Graphics Double Data Rate) SDRAM, RDRAM (Rambus Dynamic Random Access Memory), static random access memory (SRAM), or the like. Alternatively, the memory device 1200 may be a nonvolatile memory device such as a resistive RAM (RRAM), a phase change memory (PRAM), a magnetoresistive memory (MRAM), a ferroelectric memory (FRAM), a spin injection magnetization reversal memory (STT-RAM), or the like. It can also be implemented in the present specification, the advantages of embodiments have been described based on DRAM, but the technical spirit of the present disclosure is not limited thereto.

As described above, according to the configuration and function of the command log register 1220 provided in the memory device 1200, the memory device 1200 outputs a command log CMD Log to the host 1100 for debugging. There may exist a case where the request of the host 1100 such as the application processor (AP) or the CPU is not valid, or the command execution fails due to an internal operation problem of the memory device 1200. In this case, in order to determine the cause of the command execution failure, it is necessary to analyze which commands were previously issued in the host 1100 and which previous commands may affect the command that failed to be executed. The memory device 1200 can easily provide the command log stored in the command log register 1220, so that the input command history can be checked without using a logic analyzer. Accordingly, when the memory device 1200 is applied, low-cost and high-reliability debugging is possible even in a memory system such as a high-bandwidth memory (HBM) or a system-in-package (SiP) having a large probing cost.

Figure 2:
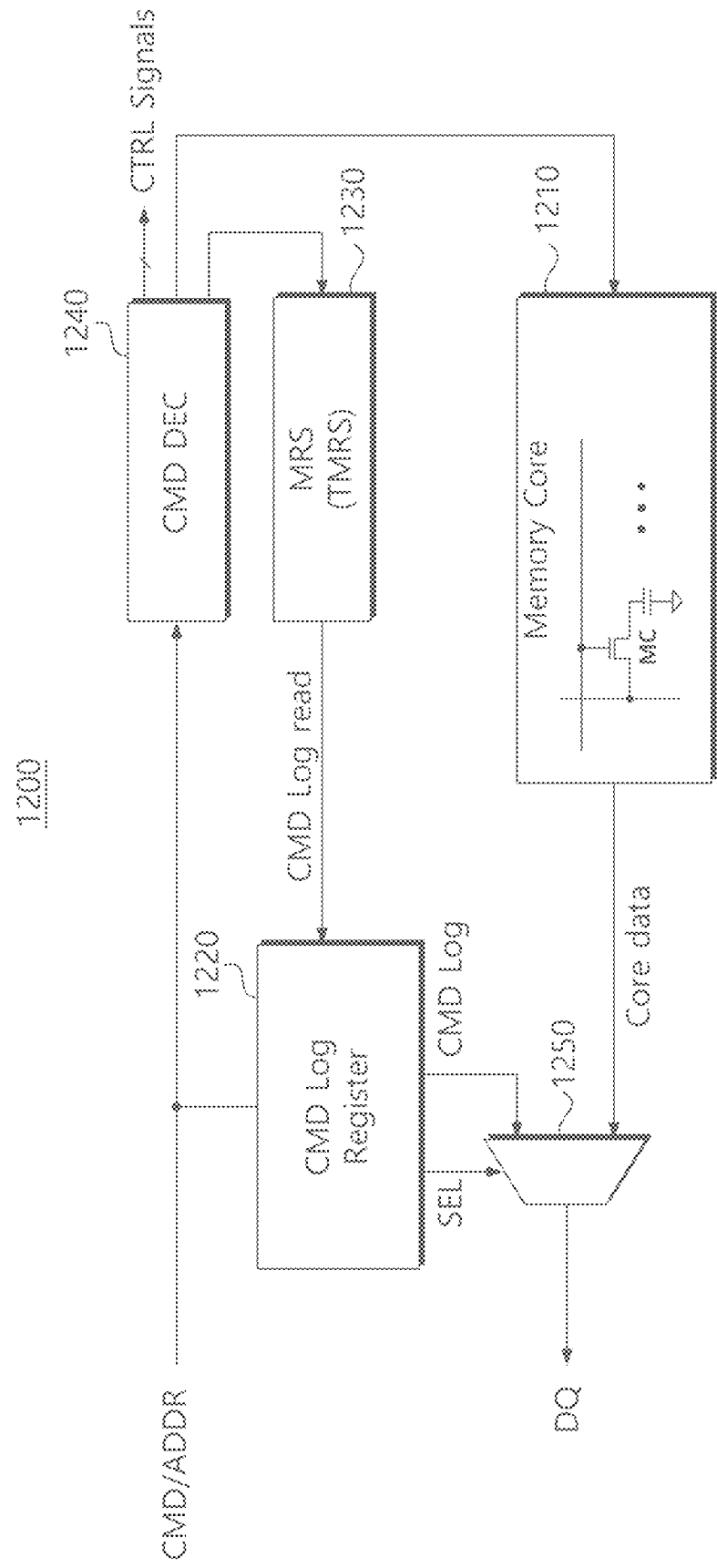
FIG. 2 is a block diagram schematically illustrating a configuration of the memory device of FIG. 1 according to an embodiment.

FIG. 2 is a block diagram schematically illustrating the memory device of FIG. 1 according to an embodiment of present invention. Referring to FIG. 2, the memory device 1200a includes a memory core 1210, a command log register 1220, a mode register set (MRS, 1230), a command decoder 1240, and a data selector 1250.

The memory core 1210 includes a plurality of memory cells MC arranged in an array form, a decoder for selecting the memory cells MC, a write driver for writing data into the memory cells MC, and a sense amplifier for reading data from the memory cells MC, and the like. During a read operation, the memory core 1210 may output core data sensed from the memory cell MC.

The command log register 1220 may store commands input to the memory device 1200 through a command/address (CA) line. When the command/address CA is input, the command transmitted to the command decoder 1240 is simultaneously stored in the command log register 1220. A transfer path of commands to be stored in the command log register 1220 may be activated using a mode register set (MRS) or test mode register set (TMRS) command. Alternatively, the command storage function of the command log register 1220 may be activated as a default, and may be deactivated through a mode register set (MRS) or test mode register set (TMRS) command.

The command log register 1220 may output a command log CMD Log in response to a command provided through the mode register set 1230. The command log register 1220 provides a command log stored therein to the data selector 1250 in response to a CMD log read signal, and generates a selection signal SEL. Then, the data selector 1250 may output the command log provided from the command log register 1220 rather than the memory core 1210 to the data line DQ.

The mode register set 1230 sets the mode registers in response to an MRS command for designating an operation mode of the memory device 1200 and an address signal ADDR. In particular, the mode register set 1230 may generate a command log read signal (CMD log read) for controlling the command log register 1220 by using a reserved register. Alternatively, it will be well understood that the mode register set 1230 may be replaced with a test mode register set (hereinafter, TMRS) for generating a command log read signal (CMD log read).

The command decoder 1240 may decode a command input through the command/address (CA) line to generate control signals (CTRL Signals) or set the mode register set 1230. When the MRS command for controlling the command log register 1220 is provided, the command decoder 1240 generates a command log read signal (CMD Log read) for outputting a command log CMD Log to the mode register set 1230.

The data selector 1250 selects data to be output to the data line DQ in response to the selection signal SEL. When the selection signal SEL from the command log register 1220 is activated, the data selector 1250 outputs the command log stored in the command log register 1220 to the data line DQ. On the other hand, when the selection signal SEL is in an inactive state, the data selector 1250 outputs core data provided from the memory core 1210 to the data line DQ.

In the above, a simple structure of the memory device 1200 capable of storing an input command log CMD Log using the command log register 1220 and outputting the stored command log CMD Log upon request has been described.

Figure 3:
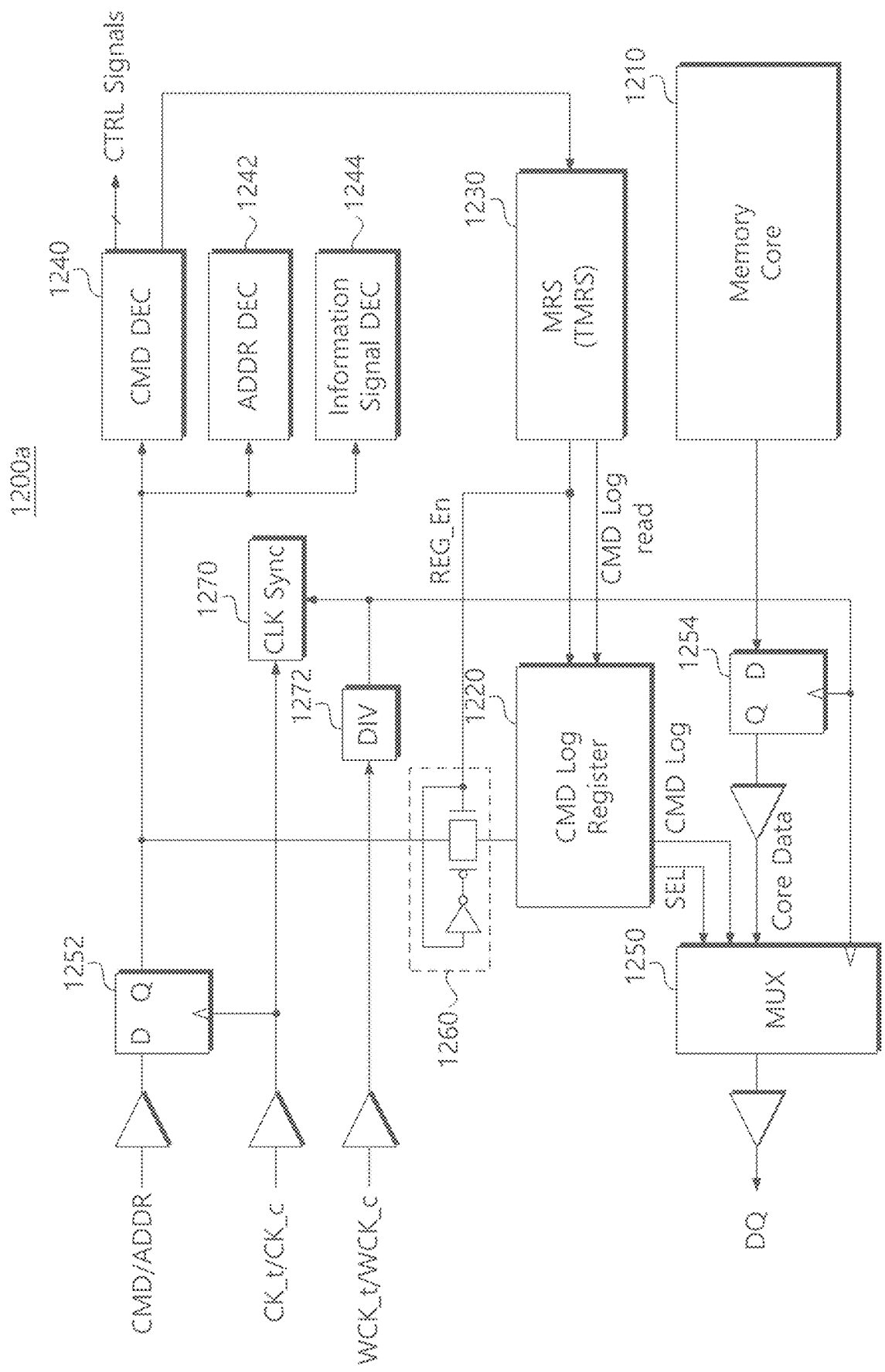
FIG. 3 is a block diagram illustrating the configuration of the memory device of FIG. 2 in more detail.

FIG. 3 is a block diagram illustrating an embodiment of the memory device of FIG. 2 in more detail. Referring to FIG. 3, the memory device 1200a includes a memory core 1210, a command log register 1220, a mode register set 1230, a command decoder 1240, an address decoder 1242, and an information signal decoder 1244, a data selector 1250, a command gate 1260, a clock synchronizer 1270, and a clock divider 1272.

The memory core 1210 may include a memory cell array divided in units of banks, a row decoder, a column decoder, a sense amplifier, a write driver, and the like. The memory core 1210 may store write-requested data in the memory device 1200 through a write driver, and read the read-requested data using a sense amplifier. In addition, the memory core 1210 may further include a refresh circuit for storing and maintaining data in the cell array or a selection circuit for selecting a row or column according to the address signal ADDR.

The command log register 1220 may sequentially store commands input to the memory device 1200 through a command/address (CA) line. When the register enable signal REG_En is activated, the command gate 1260 is turned on and a command/address (CA) path from the flip-flop 1252 to the command log register 1220 is generated. At the same time, in response to the activation of the register enable signal REG_En, the command log register 1220 may activate the storage function of the input command. Then, the command log register 1220 may generate a command log CMD Log by sequentially storing commands input to the command/address (CA) line.

In addition, the command log register 1220 may output the stored command log to the outside in response to a command provided through the mode register set 1230 or TMRS. The command log register 1220 may output a command log CMD Log stored therein through the data line DQ in response to a command provided from the host 1100 such as a debugging device. At this time, the command log register 1220 provides a selection signal SEL for selecting one of the core data from the memory core 1210 and the command log from the command log register 1220 to the data selector 1250. When the selection signal SEL is activated, the command log is output to the outside of the memory device 1200 through the data line DQ.

The mode register set 1230 sets internal mode registers in response to an MRS command and the address ADDR for designating an operation mode of the memory device 1200. Reserved registers may be used in the mode register set 1230 to generate a register enable signal REG_En or a command log read signal (CMD Log read). In another embodiment, a separate Test Mode Register Set (TMRS) may be used to generate a register enable signal REG_En or a command log read signal (CMD Log read).

The command decoder 1240 determines an input command with reference to signals (/RAS,/CAS,/WE) applied from the outside. The command decoder 1240 may write data into the cell array of the memory core 1210 or read the written data in response to a command provided from the outside. Also, the command decoder 1240 may write data to the mode register set 1230 according to an externally provided command and address. For example, a general auto refresh operation command is input through a combination of control signals (/RAS,/CAS,/WE). Then, the refresh operation is determined by the command decoder 1240, and the refresh command is provided to the refresh control logic by the mode register set 1230. Similarly, a command for generating the register enable signal REG_En or generating the command log read signal (CMD Log read) may also be transmitted to the mode register set 1230 through the command decoder 1240.

Addresses and other control signals provided through a command/address line (CA) may be transmitted to the address decoder 1242 and the information signal decoder 1244 in the same manner. Then, the address decoder 1242 and the information signal decoder 1244 extract the address and information signals through the decoding operation and deliver them to necessary components.

The data selector 1250 selects data to be output to the data line DQ in response to the selection signal SEL. When the selection signal SEL from the command log register 1220 is activated, the data selector 1250 outputs the command log stored in the command log register 1220 to the data line DQ. On the other hand, when the selection signal SEL is in an inactive state, the data selector 1250 outputs core data provided from the memory core 1210 to the data line DQ. Core data may be input to the data selector 1250 via the flip-flop 1254.

The clock synchronizer 1270 synchronizes the clock signals CK_t/CK_c and the data clock signals WCK_t/WCK_c. The clock divider 1272 divides the externally input data clock signals WCK_t/WCK_c and provides them to the clock synchronizer 1270 or the data selector 1250. During a read operation, core data may be output to the data line DQ in synchronization with the divided data clock signals WCK_t/WCK_c.

Figure 4A:
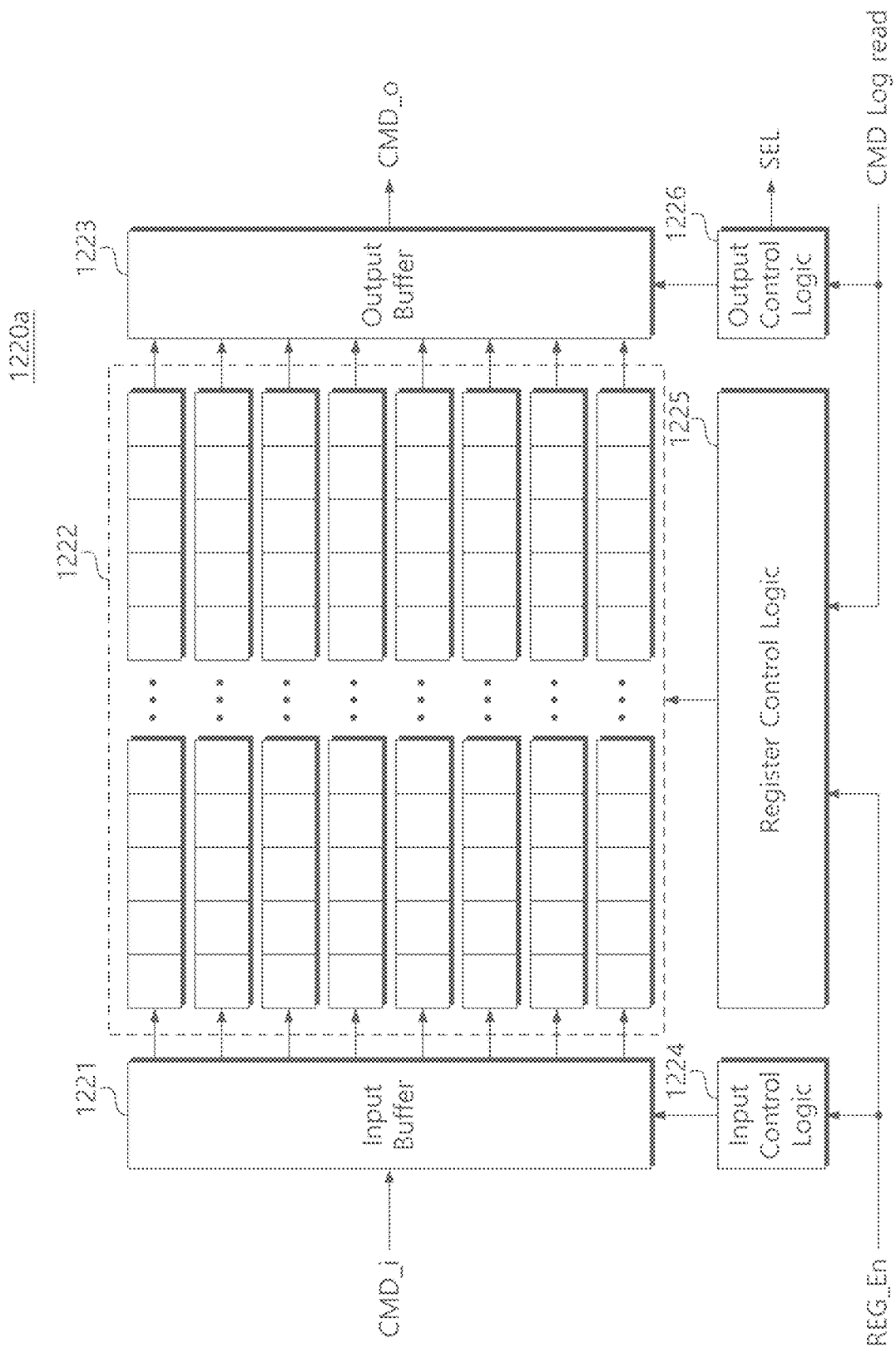
FIGS. 4A and 4B are block diagrams illustrating configurations of the command log register of FIG. 3.
Figure 4B:
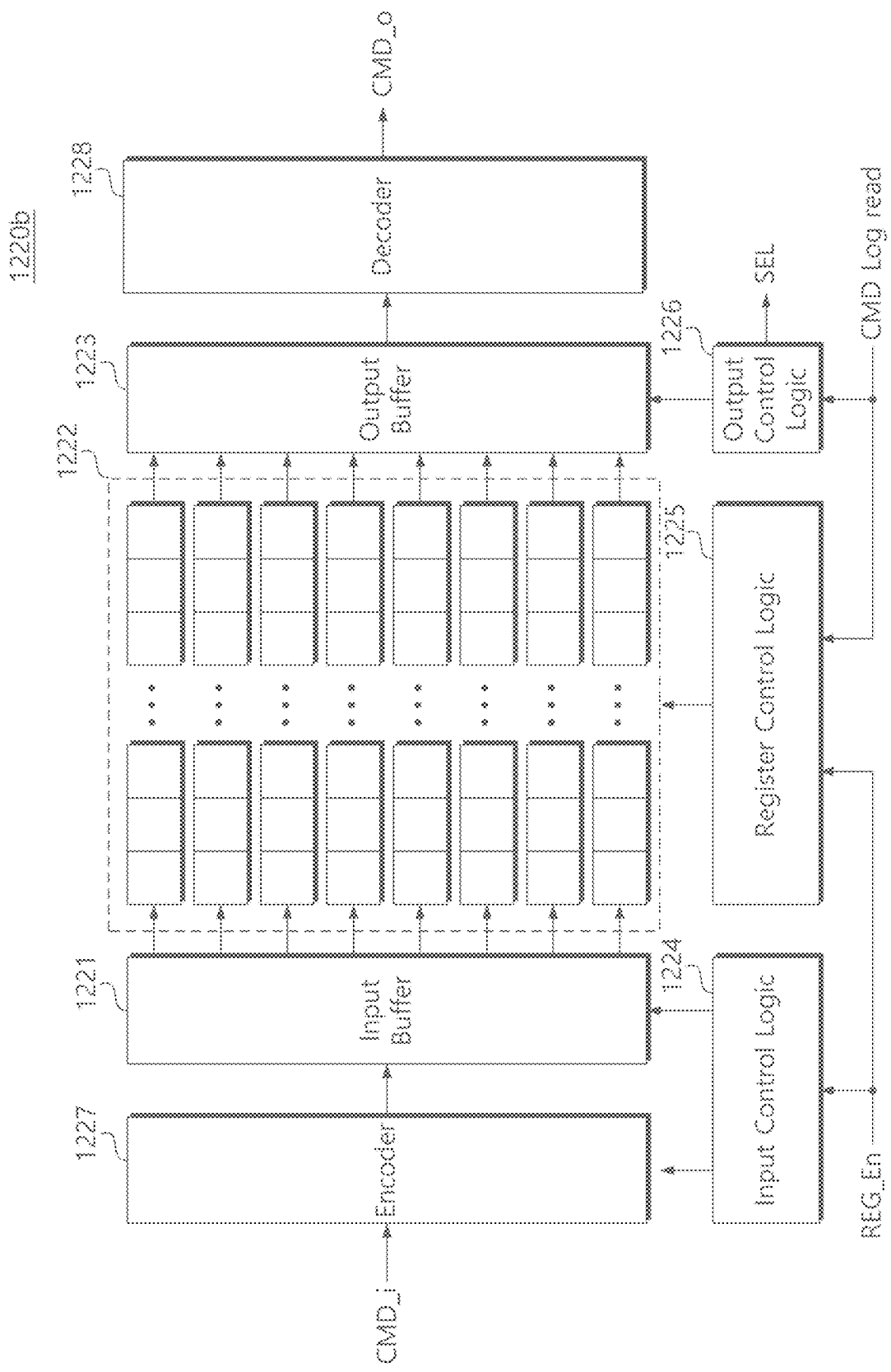

FIGS. 4A and 4B are block diagrams illustrating elements of the command log register of FIG. 3. Referring to FIG. 4A, the command log register 1220a includes an input buffer 1221, a register unit 1222, an output buffer 1223, an input control logic 1224, a register control logic 1225, and an output control logic 1226. Here, the input control logic 1224, the register control logic 1225, and the output control logic 1226 may be combined into one control logic circuit.

The input buffer 1221 receives the input command CMD_i under the control of the input control logic 1224 and transfers it to the register unit 1222. When the register enable signal REG_En is activated, the input command CMD_i is provided to the input buffer 1221 through the generated command path. Then, the input control logic 1224 sequentially transfers the input command CMD_i to the register unit 1222.

The register unit 1222 stores a queue of commands passed through the input buffer 1221 under the control of the register control logic 1225. Commands may be stored in the register unit 1222 while being sequentially shifted in units of I/O. A method of managing the command queue of the register unit 1222 may be implemented as a linear queue or a circular queue method.

The output buffer 1223 provides the commands stored in the queue in the register unit 1222 as the output command CMD_o under the control of the output control logic 1226. The output control logic 1226 controls to output the commands stored in the register unit 1222 as an output command CMD_o in response to a command log read signal (CMD log read) provided from the mode register set 1230.

The input control logic 1224 and the register control logic 1225 control the input buffer 1221 and the register unit 1222 to sequentially store the input command CMD_i input in response to the register enable signal REG_En.

The register control logic 1225 and the output control logic 1226 control the register unit 1222 and the output buffer 1223 to sequentially output the commands stored in the queue in response to a command log read signal (CMD Log read). In particular, the output control logic 1226 outputs the selection signal SEL so that the data selector 1250 (refer to FIG. 3) outputs the command log in response to the command log read signal (CMD Log read).

The configuration of the command log register 1220a according to the above-described embodiment can be implemented in various ways. It will be understood that the number of commands that can be stored in the command log register 1220a may be variously adjusted according to the number of registers constituting the register unit 1222.

FIG. 4B is a block diagram illustrating a command log register 1220b according to another embodiment capable of storing a larger number of commands compared to the register of FIG. 4A while having the same register size. Referring to FIG. 4B, the command log register 1220b includes an encoder 1227 in front of the input buffer 1221 to encode the command/address CA, and the command compressed by encoding into the register unit 1222 can be stored.

The command log register 1220b may include an input buffer 1221, a register unit 1222, an output buffer 1223, input control logic 1224, register control logic 1225, and output control logic 1226. In addition, the command log register 1220b further includes an encoder 1227 that encodes command/address (CA) at the front end of the input buffer 1221 and a decoder 1228 that performs decoding at the rear end of the output buffer 1223. The encoder 1227 may use any encoding scheme capable of compressing the input command (CMD_i, for example, CA[6:0]) from 7-bit to 6-bit or smaller bit size. On the other hand, the decoder 1228 may be implemented in a manner that decodes the compressed command to the original size.

The command log register 1220b is the same except that the encoder 1227 and the decoder 1228 are further included in the command log register 1220a of FIG. 4A. Accordingly, the functions of the input buffer 1221, the register unit 1222, the output buffer 1223, the input control logic 1224, the register control logic 1225, and the output control logic 1226 are substantially the same as those of FIG. 4A.

In another embodiment, the decoder 1228 in the command log register 1220b may be omitted. This is because the decoding operation may be performed by the host 1100. When decoding is performed by the host 1100, a small size command log CMD Log can be output, so that the transmission speed can be increased and the cost can be reduced.

According to the configuration of the command log register 1220b according to the above-described embodiment, a larger number of commands can be stored even using the register unit 1222 having the same size as the command log register 1220a.

Figure 5A:
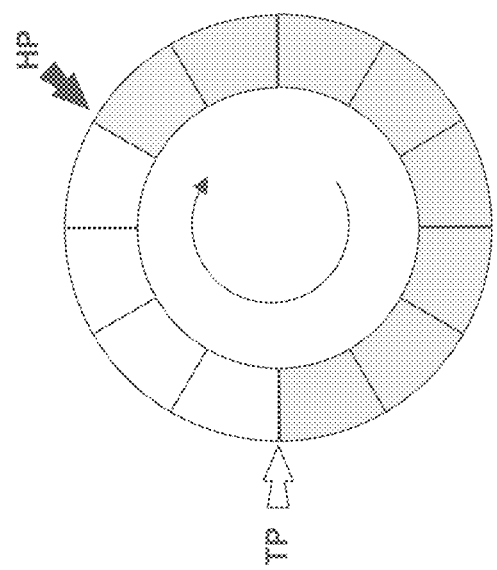
FIGS. 5A and 5B are diagrams schematically illustrating an example of a configuration method of a command log register according to an embodiment.
Figure 5B:
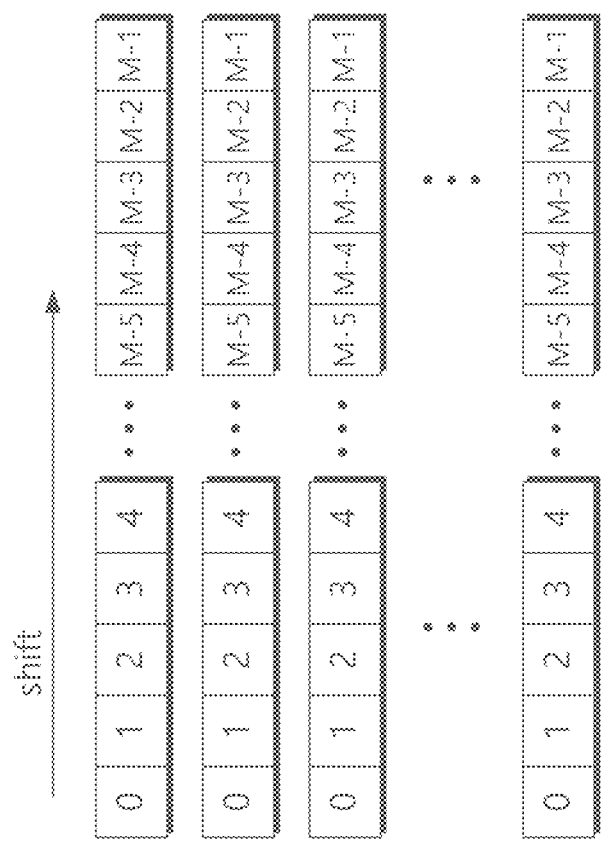

FIGS. 5A and 5B are diagrams schematically illustrating an example of a configuration method of a command log register according to embodiments. Referring to FIG. 5A, the command log register 1220a may be implemented in the form of a ring buffer or a circular queue. According to the control of the input buffer 1221 or the output buffer 1223, the input command CMD_i may be stored in the register unit 1222 in units of pre-determined bits (or units of words or bytes). When these input commands CMD_i are sequentially stored, the register control logic 1225 updates the tail pointer TP. Similarly, when the command log stored in the register unit 1222 is output as the output command CMD_o in word unit or byte unit, the register control logic 1225 will move the head pointer HP by the output size. When the register control logic 1225 manages the command log register 1220a in a circular queue scheme, the register control logic 1225 manages the head pointer HD and the tail pointer TP according to the number of input commands CMD_i and the number of output commands CMD_o.

Referring to FIG. 5B, the command log register 1220b may be implemented in the form of a first-in-first-out (FIFO) buffer or a linear queue. According to the control of the input buffer 1221 or the output buffer 1223, the input command CMD_i may be stored in a specific bit unit in the register unit 1222. When these input commands CMD_i are sequentially stored, data may be stored up to the 'M−1'th register. The output of the command log register 1220b may be sequentially output from the 'M−1'th command while commands stored in the register are sequentially shifted.

In the above, examples of the implementation method of the command log register 1220 have been briefly described. However, it will be well understood that the method of storing and outputting commands is not limited to the above description and that various register management methods may be applied.

Figure 6:
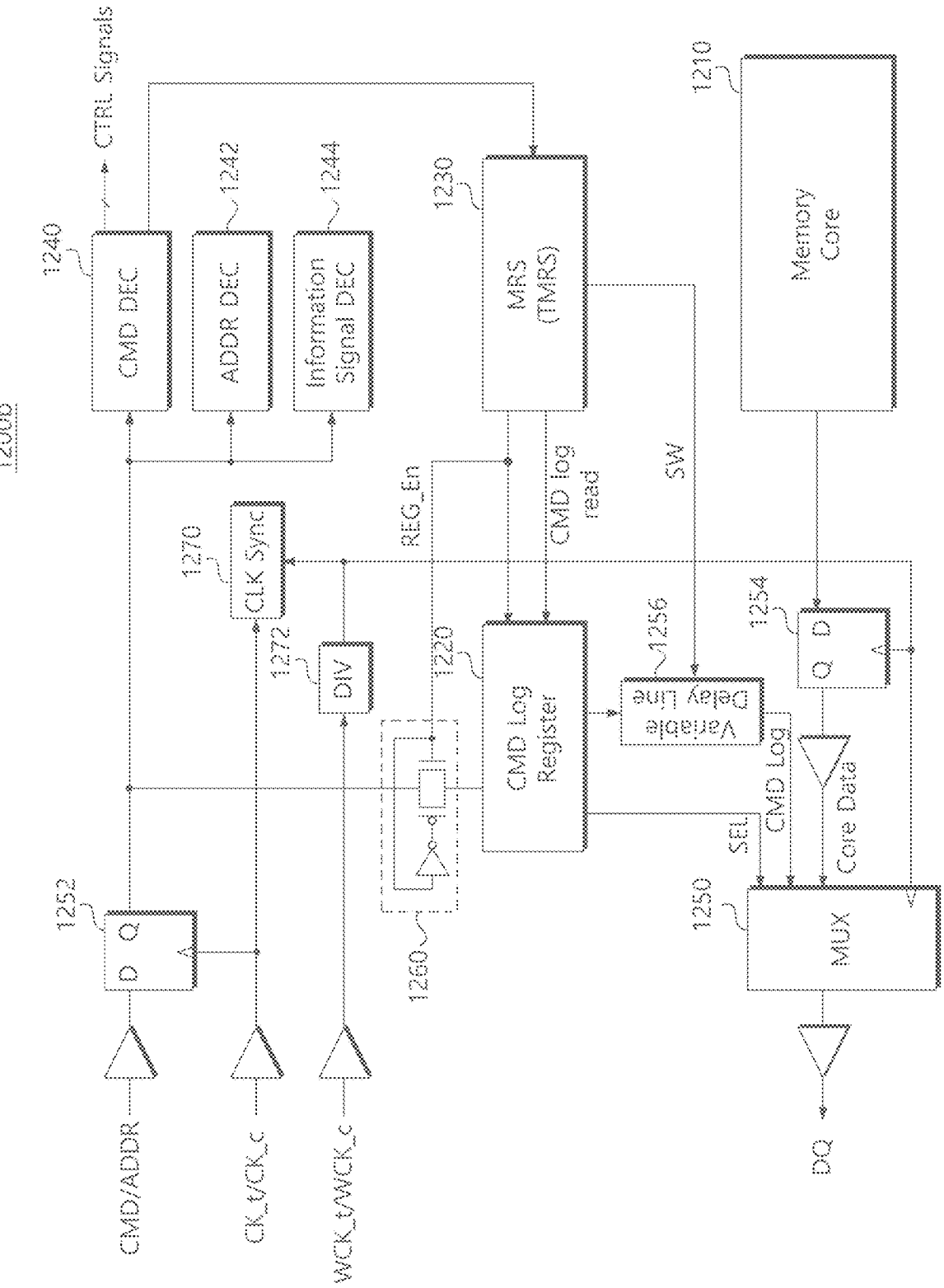
FIG. 6 is a block diagram illustrating another embodiment of the memory device shown in FIG. 2.

FIG. 6 is a block diagram illustrating another embodiment of the memory device shown in FIG. 2. Referring to FIG. 6, the memory device 1200b includes a variable delay line 1256 in addition to the memory device 1200a of FIG. 3. Accordingly, the memory core 1210, the command log register 1220, the mode register set (MRS, 1230), the command decoder 1240, the address decoder 1242, the information signal decoder 1244, the data selector 1250, the command gate 1260, the clock synchronizer 1270, and the clock divider 1272 are substantially the same as those of FIG. 3, a description thereof will be omitted.

The variable delay line 1256 delays the command log output from the command log register 1220 by a specific delay and transmits it to the data selector 1250. The variable delay line 1256 may set the output latency (hereinafter, log latency) of the command log to be the same as the read latency of the Core Data. For example. The variable delay line 1256 may be controlled by a switch control signal SW provided from the mode register set 1230 or a TMRS. That is, the magnitude of the delay provided by the variable delay line 1256 may be adjusted by the switch control signal SW. A specific structure of the variable delay line 1256 will be described in detail with reference to the drawings to be described later.

Through the setting of the variable delay line 1256, the log latency, which indicates delay from when the MRS command is input to the point when the command log is output to the data line DQ, can be synchronized with the read latency. Through adjustment of the delay tap of the variable delay line 1256 by the switch control signal SW, the magnitude of the log latency may be adjusted. For example, in order to minimize log latency, the number of delay taps of the variable delay line 1256 may be minimized using the switch control signal SW.

Additionally, although it has been described that only the Log latency of the command log can be varied through the variable delay line 1256, the latency of the selection signal SEL can also be adjusted. That is, through the variable delay line 1256, both the selection signal SEL and the command log may be adjusted to have the same size as the read latency or to a different size.

Figure 7A:
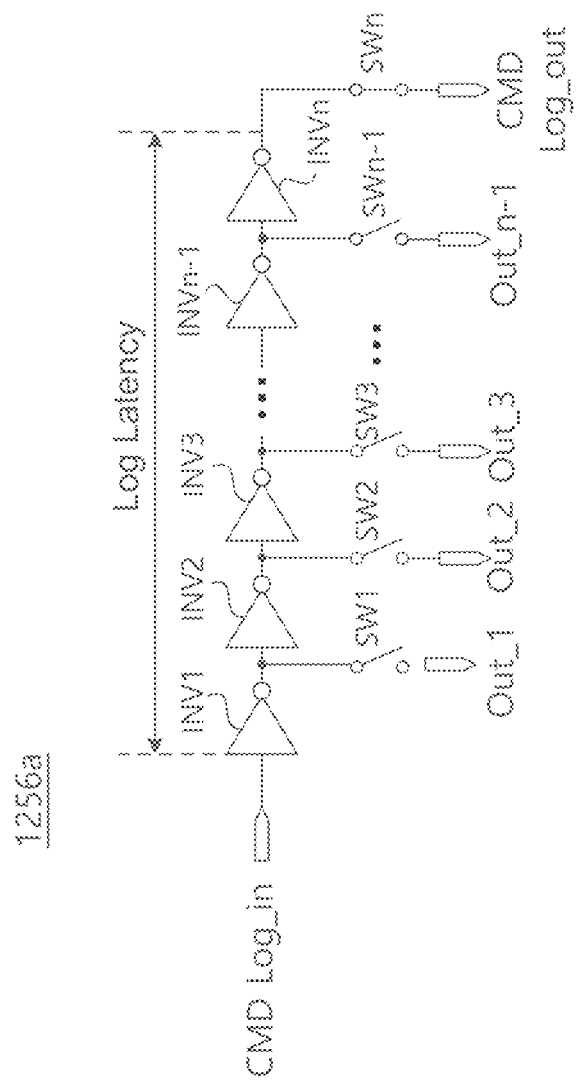
Figure 7C:
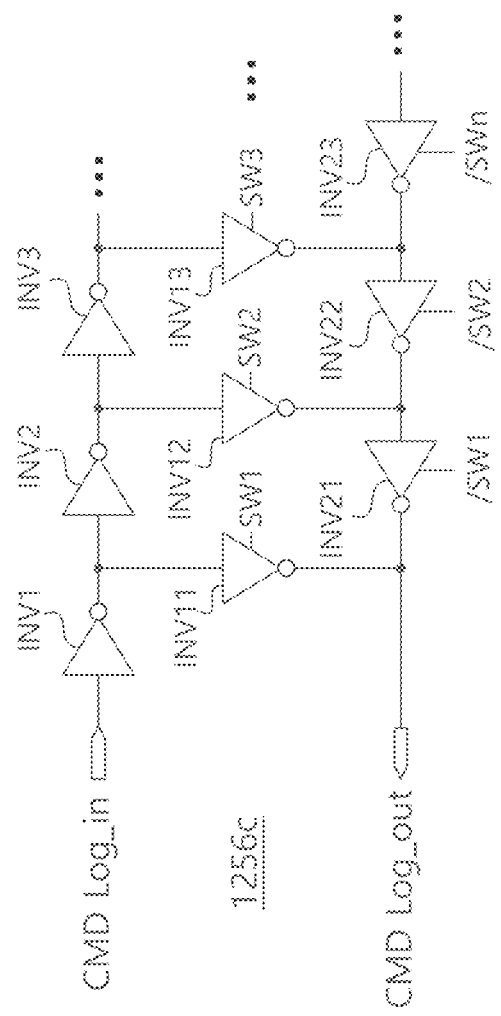

FIGS. 7A, 7B and 7C are circuit diagrams showing the variable delay line of FIG. 6. FIG. 7A is a circuit diagram showing a variable delay line for setting a delay size of a command log CMD Log using inverters INVs. Referring to FIG. 7A, the variable delay line 1256a uses a plurality of inverters INV1 to IVNn as delay elements. That is, the variable delay line 1256a may use one of the outputs Out_1 to Out_n of the plurality of inverters INV1 to IVNn as the delayed output CMD Log_out of the input command log CMD Log_in. At this time, the output (CMD Log_out) selected by the switch control signal (e.g., SWn) is determined as a Log latency value. That is, any one (e.g., Out_n) selected from among the plurality of outputs Out_1 to Out_n may be used as the delayed output CMD Log_out. Any one selected as log latency among the plurality of outputs Out_1 to Out_n may be transmitted to the data selector 1250 (refer to FIG. 6).

FIG. 7B is a circuit diagram showing a variable delay line for setting a delay size of a command log CMD Log using a flip-flop. At this time, the delay size may be set equal to the read latency of the memory device 1200b. Referring to FIG. 7B, the variable delay line 1256b uses a plurality of flip-flops FF1 to FFn as delay elements. That is, the variable delay line 1256b may use one of the outputs Out_1 to Out_n of the plurality of flip-flops FF1 to FFn as the delayed output CMD Log_out of the input command log CMD Log_in. That is, any one (e.g., Out_n) selected from among the plurality of outputs Out_1 to Out_n may be used as the delayed output CMD Log_out. One of the plurality of outputs Out_1 to Out_n corresponding to log latency may be selected through any one of the switches SW1 to SWn that is turned on. The output CMD Log_out delayed by the selected switch may be transmitted to the data selector 1250 (refer to FIG. 6).

FIG. 7C is a circuit diagram showing a variable delay line for setting a delay size of a command log using an inverter network. Referring to FIG. 7C, the variable delay line 1256c constitutes a network of a plurality of inverters, and selects a transmission path of the input command log CMD Log_in using complementary switch control signals (e.g., SW1 and /SW1). For example, when only the switch control signals SW2 and/SW2 are activated, only the inverters INV1 and INV2 and the inverters INV12 and INV21 are turned on to activate a transmission path of the input command log CMD Log_in.

It will be well understood that the above-described variable delay lines 1256a, 1256b, and 1256c are only examples for setting Log Latency. Various delay line circuits for adjusting the latency of the command log output from the command log register 1220 may be implemented by changing or adjusting the above-described variable delay lines 1256a, 1256b, and 1256c.

Figure 8:
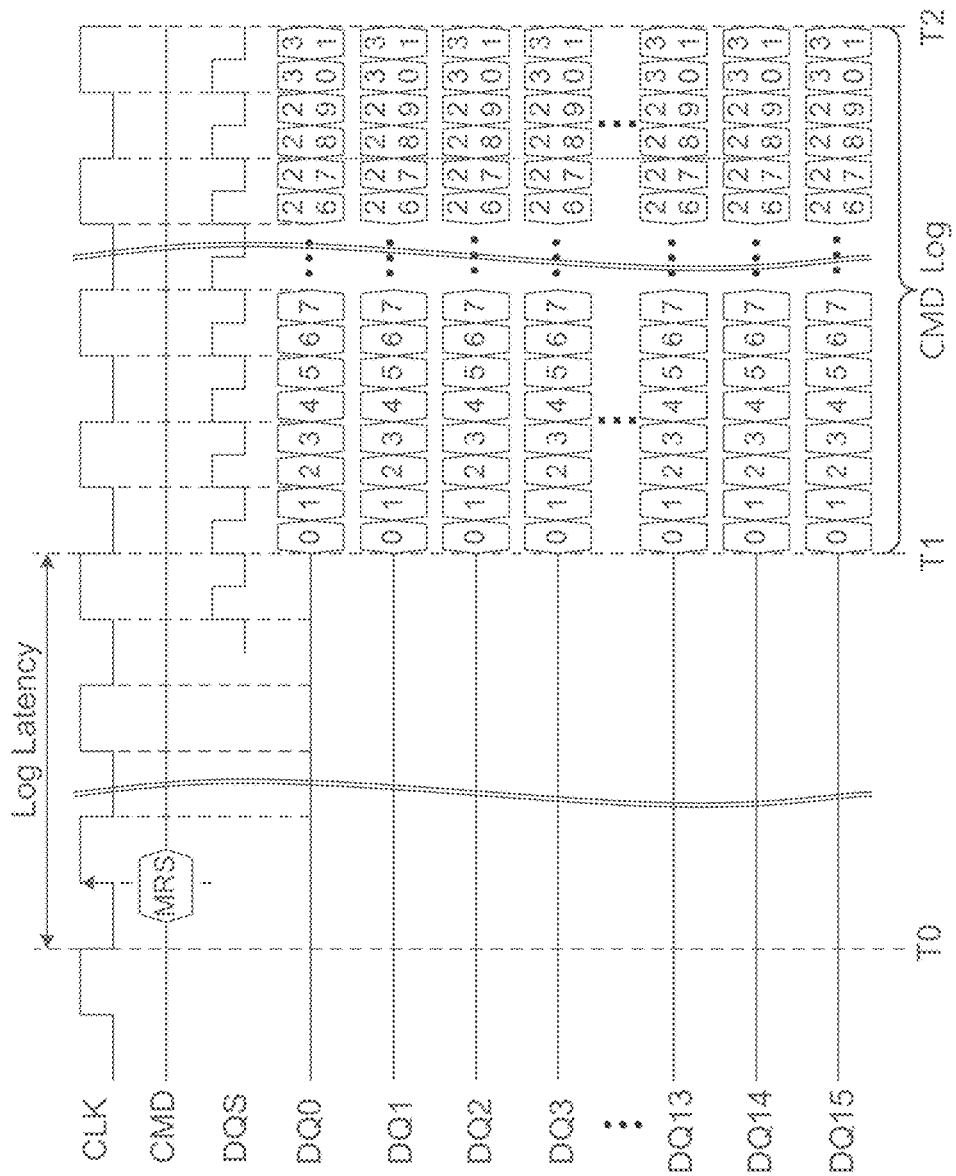
FIG. 8 is a timing diagram illustrating an operation of outputting command log data of a memory device according to embodiments.

FIG. 8 is a timing diagram illustrating an operation of outputting command log data of a memory device according to embodiments. Referring to FIG. 8, a command log CMD Log may be output after a Log Latency of a set size in response to an MRS command for outputting a command log CMD Log.

When the data line DQ is provided with 16 pins, a 16-bit command log CMD Log may be output at each transition of the data strobe signal DQS. This means that two commands can be output during one transition of the data strobe signal DQS. In the illustrated timing diagram, a 32-bit long command log CMD Logs output through 16 data lines DQs. This means that 64 commands of one word size (8-bit) can be stored and provided externally. The size of the command log that can be provided externally is determined according to the number of registers included in the command log register 1220.

Figure 9:
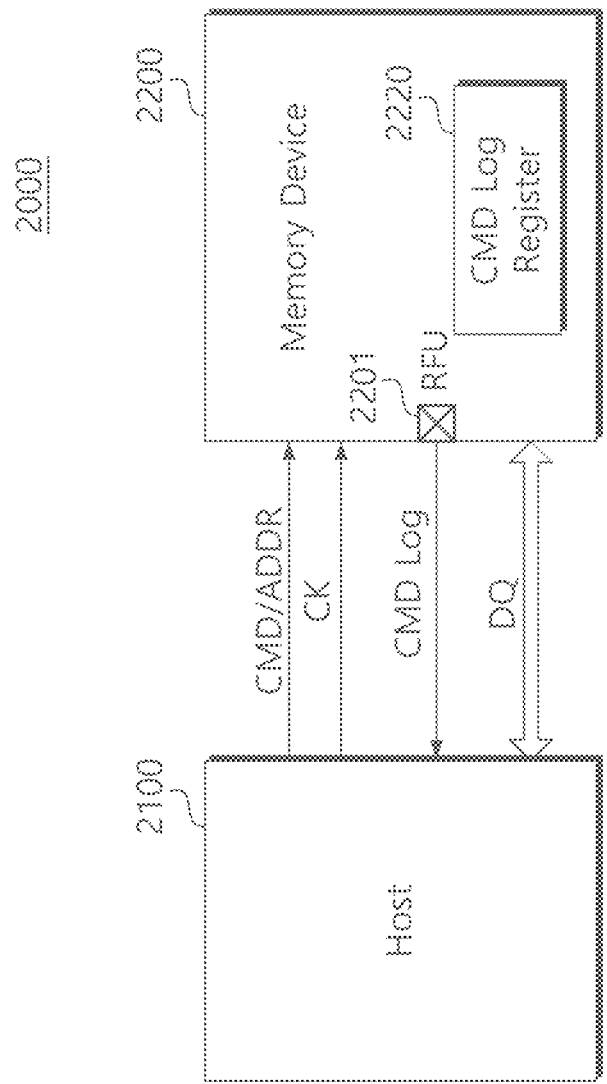
FIG. 9 is a block diagram illustrating a memory system including a memory device according to another embodiment.

FIG. 9 is a block diagram illustrating a memory system including a memory device according to another embodiment. Referring to FIG. 9, the memory system 2000 may include a host 2100 and a memory device 2200 that outputs a command log CMD Log through a Reserved Future Use (RFU) pin 2201.

The host 2100 may generate a command CMD and an address ADDR for writing data to the memory device 2200 or reading data stored in the memory device 2200. The host 2100 may be at least one of a memory controller for controlling the memory device 2200, a system-on-chip (SoC) such as an application processor AP, a CPU, and a GPU. Alternatively, the host 2100 may be a test device or a debugging device for testing the memory device 2200.

The host 2100 may provide a command to the memory device 2200 to receive a command log CMD Log stored in the memory device 2200. For example, the host 2100 may control activation or input/output of the command log register 2220 of the memory device 2200 using a mode register set MRS or test mode register set TMRS command.

In this embodiment, the host 2100 may receive the command log through the RFU pin 2201 of the memory device 2200 rather than the data line DQ. In order to receive the command log through the separately provided data path, the host 2100 may include additional receiving circuits. Through the command log output from the RFU pin 2201, the host 2100 can determine which commands were issued before the fail command. In addition, the host 2100 can analyze the fail command and any previous commands that may affect the execution of the fail command.

The memory device 2200 outputs read data requested by the host 2100 to the host 2100 or stores data requested to be written by the host 2100 in a memory cell. In particular, the memory device 2200 stores the input commands CMD in the command log register 2220 and outputs the stored command log CMD Log through the RFU pin 2201 when the host 2100 requests it. Alternatively, when a reset signal (/RESET) from the host 2100 is input, the memory device 2200 automatically outputs a command log CMD Log through the RFU pin 2201 by controlling the command log register 2220 and I/O devices. The memory device 2200 may adjust the latency when outputting the command log (hereinafter, log latency) to be the same as or different from the latency when outputting data stored in the memory cell (hereinafter, read latency).

Figure 10:
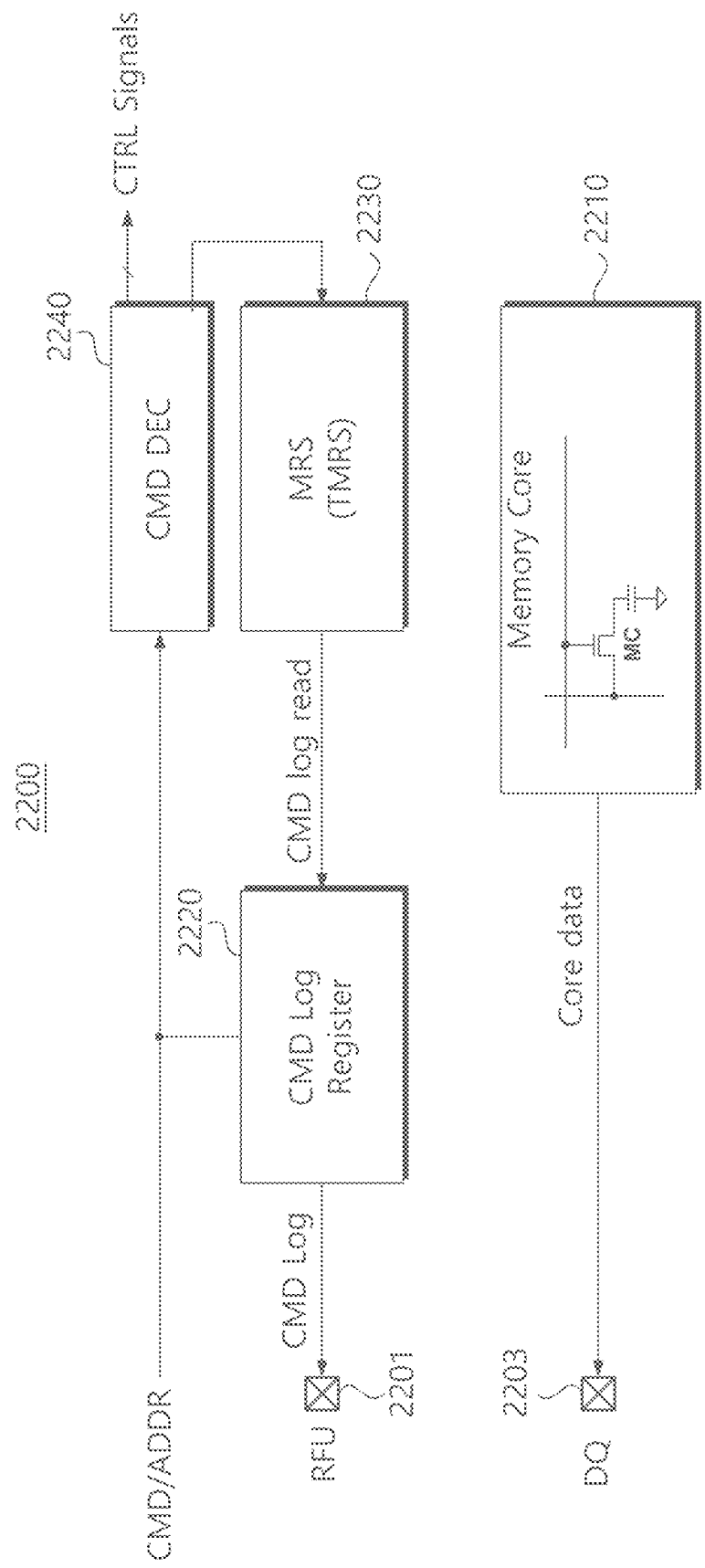
FIG. 10 is a block diagram schematically illustrating the configuration of the memory device of FIG. 9.

FIG. 10 is a block diagram schematically illustrating the configuration of the memory device of FIG. 9. Referring to FIG. 10, the memory device 2200 includes a memory core 2210, a command log register 2220, a mode register set 2230, and a command decoder 2240. The memory device 2200 is different from the memory device 1200 of FIG. 2 in that it does not include a data selector 1250. That is, the memory core 2210, the mode register set 2230, and the command decoder 2240 are substantially the same as those of FIG. 2. Therefore, a description thereof will be skipped.

The command log register 2220 stores commands input to the memory device 2200 through a command/address line. When the command/address CA is input, the command transmitted to the command decoder 2240 is simultaneously stored in the command log register 2220. The command transfer path to the command log register 2220 may be activated using a mode register set MRS or test mode register set TMRS command. Alternatively, the command storage function of the command log register 2220 may be activated as a default, and may be deactivated through a mode register set MRS or test mode register set TMRS command.

The command log register 2220 may output stored commands as a command log CMD Log_in response to a command provided through the mode register set 2230. The command log register 2220 outputs a stored command log CMD Log through the RFU pin 2201 in response to a command log read signal transmitted through the mode register set 2230. Since the DQ pin 2203 is not used when the command log of the command log register 2220 is output, the command log register 2220 does not generate the selection signal SEL for selecting the output pin. That is, the data path (via the RFU pin) for the output of the command log and the output path of the core data (Core data) can be separated and operated independently of each other.

In the above, a simple structure of the memory device 2200 using a separate RFU pin 2201 for outputting a command log CMD Log has been described.

Figure 11:
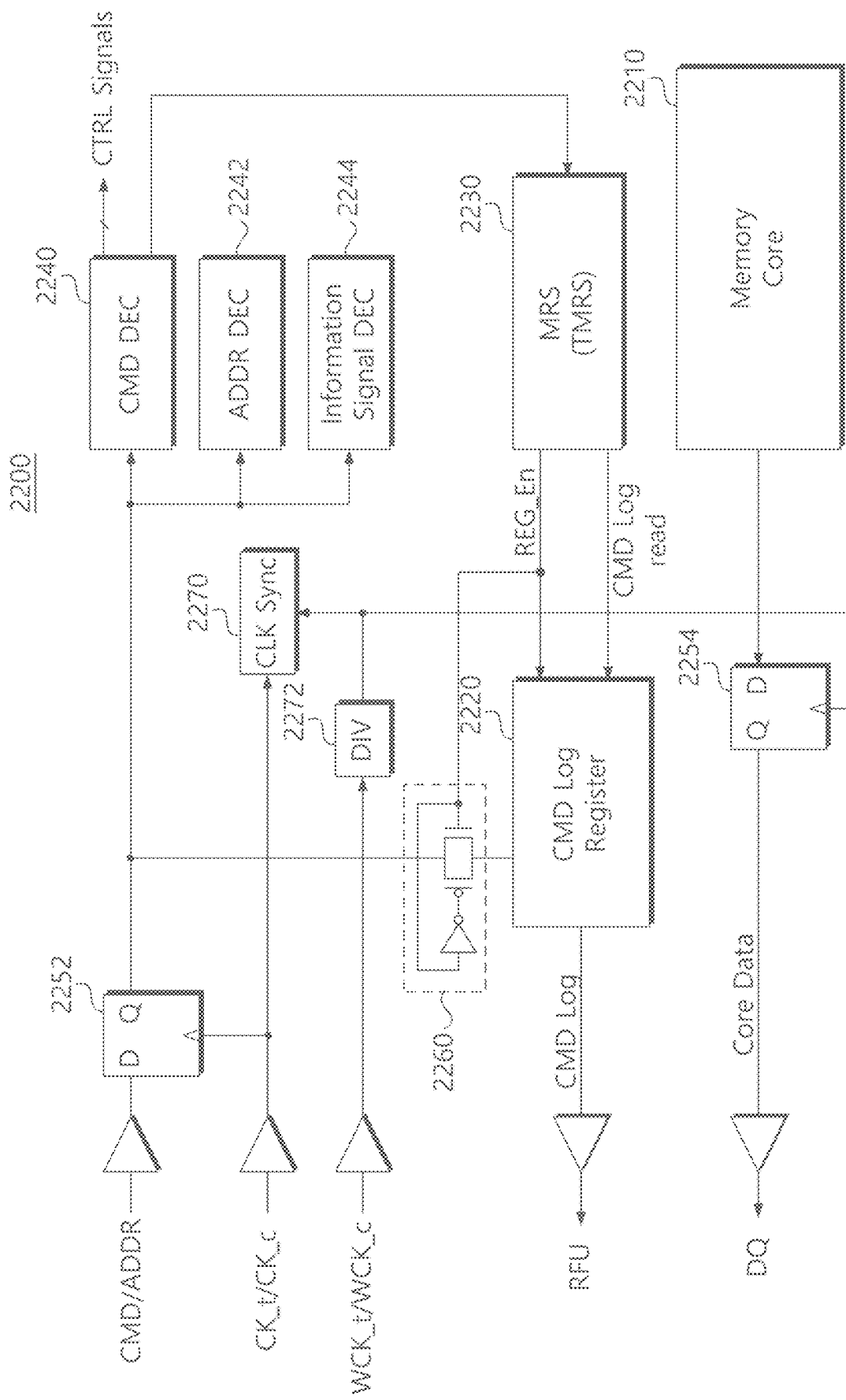
FIG. 11 is a block diagram illustrating the configuration of the memory device of FIG. 10 in more detail.

FIG. 11 is a block diagram illustrating the configuration of the memory device of FIG. 10 in more detail. Referring to FIG. 11, the memory device 2200 includes a memory core 2210, a command log register 2220, a mode register set 2230, a command decoder 2240, an address decoder 2242, and an information signal decoder 2244, a command gate 2260, a clock synchronizer 2270, and a clock divider 2272. Since the memory device 2200 does not share the output pins of the core data and the command log, there is no need to include a selection circuit such as a multiplexer. Here, the memory core 2210, the mode register set 2230, the command decoder 2240, the address decoder 2242, the information signal decoder 2244, the command gate 2260, the clock synchronizer 2270, and the clock divider 2272 are substantially the same as those of FIG. 3. Accordingly, descriptions thereof will be omitted.

The command log register 2220 sequentially stores commands input to the memory device 2200 through a command/address line. When the register enable signal REG_En is activated, the command gate 2260 is turned on and a command/address CA path from the flip-flop 1252 to the command log register 2220 is activated. At the same time, in response to the activation of the register enable signal REG_En, the command log register 2220 is activated to store an input command. Then, the command log register 2220 may constitute the command log by sequentially storing commands input to the command/address line.

In addition, the command log register 2220 may output the stored command log CMD Log to the outside in response to a command provided through the mode register set 2230 or TMRS. When outputting the command log, the command log register 2220 transmits the command log to the host 2100 (refer to FIG. 9) using the RFU pin 2201 (see FIG. 9). That is, the DQ pin 2203 (refer to FIG. 9) for outputting core data is not shared for outputting the command log. Accordingly, the memory device 2200 does not include an element or function for sharing the DQ pin 2203 when outputting a command log CMD Log.

Figure 12:
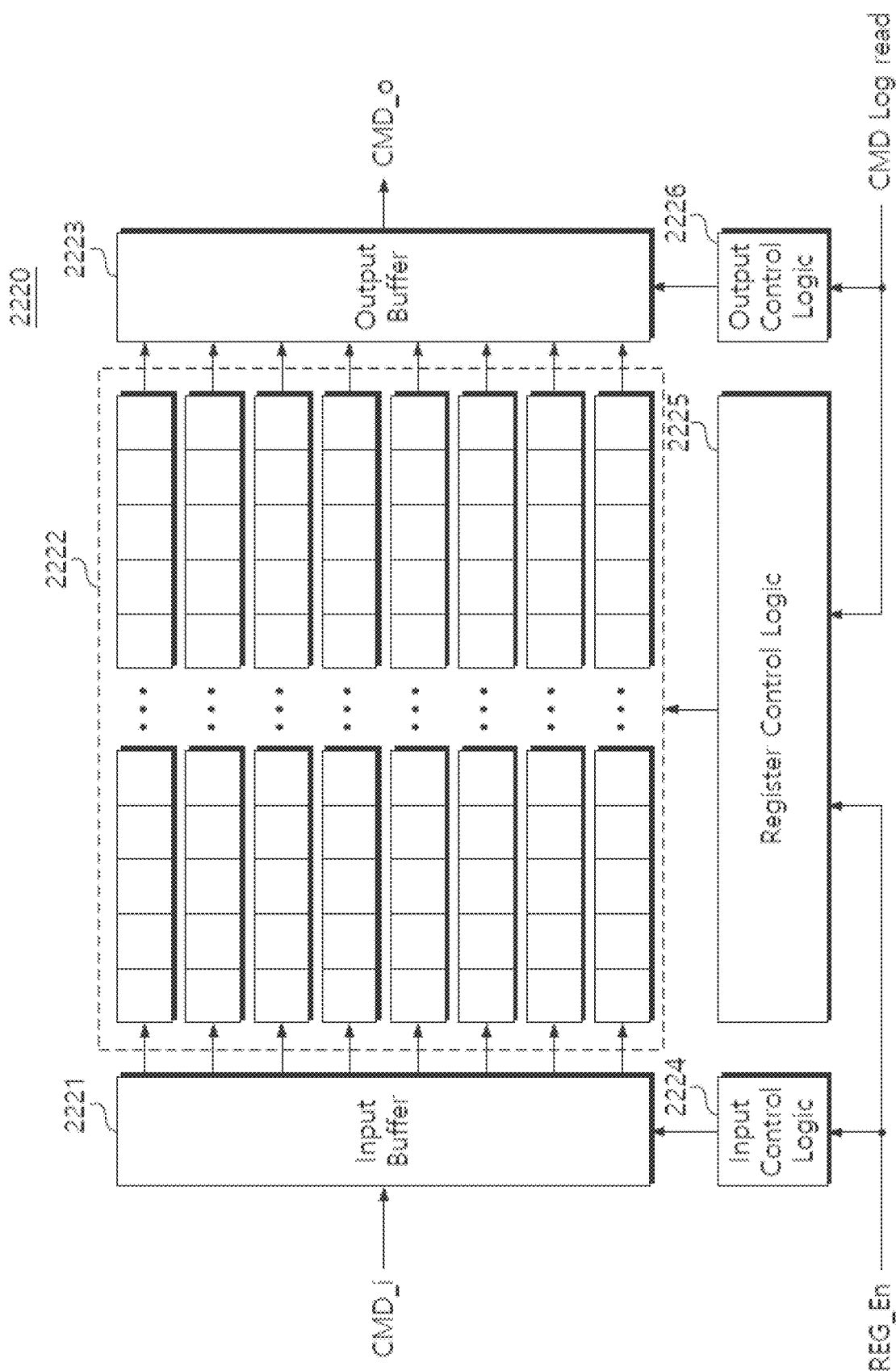
FIG. 12 is a block diagram showing the configuration of the command log register of FIG. 11.

FIG. 12 is a block diagram showing the command log register of FIG. 11. Referring to FIG. 12, the command log register 2220 may have a structure similar to that of the command log register 1220a illustrated in FIG. 4A. However, the command log register 2220 may be differentiated from the command log register 1220a shown in FIG. 4A in that it does not generate a selection signal SEL for controlling the data selector 1250 (refer to FIG. 3).

The input buffer 2221 receives the input command CMD_i under the control of the input control logic 2224 and transmits it to the register unit 2222. When the register enable signal REG_En is activated, the input command CMD_i is provided to the input buffer 2221 through the activated command path. Then, the input control logic 2224 sequentially transfers the input command CMD_i to the register unit 2222.

The register unit 2222 stores a queue of commands passed through the input buffer 2221 under the control of the register control logic 2225. Command queues may be stored in the register unit 2222 while being sequentially shifted in units of I/O. A method of managing the command queue of the register unit 2222 may be implemented as a linear queue or a circular queue method.

The output buffer 2223 provides the commands stored in the queue in the register unit 2222 as the output command CMD_o under the control of the output control logic 2226. The output control logic 2226 controls to output the commands stored in the register unit 2222 as an output command CMD_o in response to a command log read signal CMD log read provided from the mode register set 2230.

The input control logic 2224 and the register control logic 2225 control the input buffer 2221 and the register unit 2222 to sequentially store the input command CMD_i input in response to the register enable signal REG_En.

The register control logic 2225 and the output control logic 2226 control the register unit 2222 and the output buffer 2223 to sequentially output the commands stored in the queue in response to a command log read signal (CMD Log read). In this embodiment, the output control logic 2226 does not generate the selection signal SEL for controlling the output path of the command log.

It will be well understood that the command log register 2220 may further include an encoder for reducing the size of the command at the front end of the input buffer 2221.

Figure 13:
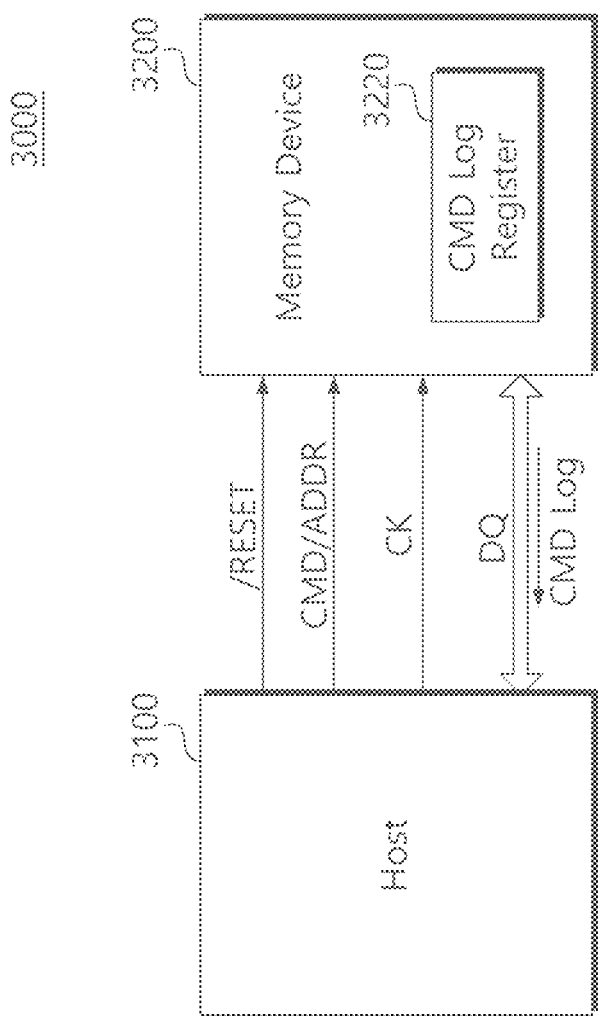
FIG. 13 is a block diagram illustrating a memory system including a memory device according to another embodiment.

FIG. 13 is a block diagram illustrating a memory system including a memory device according to another embodiment. Referring to FIG. 13, the memory system 3000 may include a host 3100 and a memory device 3200 that provides a command log CMD Log_in response to a reset signal/RESET.

The host 3100 may generate a command CMD, an address ADDR, and a clock signal CK for accessing the memory device 3200. The host 3100 may provide a command, an address, and write data for writing data to the memory device 3200. The host 3100 may be a test device or a debugging device for testing the memory device 3200. In this case, the host 3100 may provide a reset signal/RESET to the memory device 3200 in order to output the command log received by the memory device 3200. The host 3100 may detect a failure or error of the memory device 3200 by referring to the command log output from the memory device 3200 in response to the reset signal/RESET.

The memory device 3200 stores input commands CMD in the command log register 3220. When the reset signal/RESET is provided, the memory device 3200 may output the command log stored in the command log register 3220 through the DQ pin or the RFU pin. The memory device 3200 may adjust log latency that occurs when a command log CMD Log is output.

As described above, the memory device 3200 may provide the command log stored in the command log register 3220 as data for debugging in response to the reset signal /RESET. When the memory device 3200 is applied, low-cost and high-reliability debugging is possible in a memory system such as a high-bandwidth memory (HBM) or a system-in-package (SiP) having a large probing cost.

Figure 14:
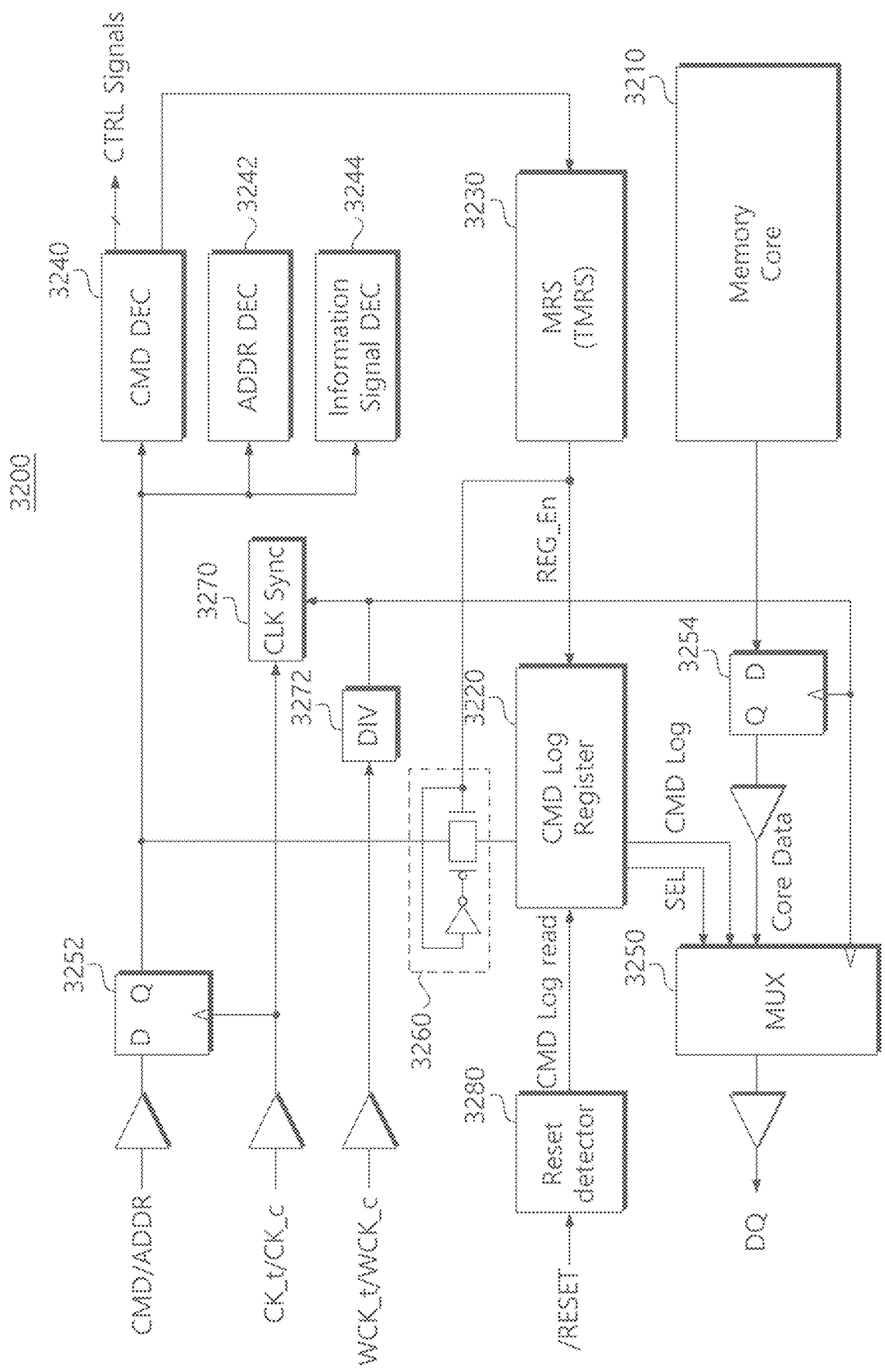
FIG. 14 is a block diagram illustrating the memory device of FIG. 13 in more detail.

FIG. 14 is a block diagram illustrating the memory device of FIG. 13 in more detail. Referring to FIG. 14, the memory device 3200 includes a memory core 3210, a command log register 3220, a mode register set 3230, a command decoder 3240, an address decoder 3242, and an information signal decoder 3244, a data selector 3250, a command gate 3260, a clock synchronizer 3270, a clock divider 3272, and a reset detector 3280.

The memory core 3210, the command decoder 3240, the address decoder 3242, the information signal decoder 3244, the data selector 3250, the command gate 3260, the clock synchronizer 3270, the clock divider 3272, and the like are substantially the same as those in FIG. 3. Therefore, a description thereof will be skipped.

The command log register 3220 sequentially stores commands input to the memory device 3200 through a command/address CA pin. When the register enable signal REG_En is activated, the command gate 3260 is turned on and a command/address path from the flip-flop 3252 to the command log register 3220 is activated. At the same time, in response to the activation of the register enable signal REG_En, the command log register 3220 will enable writing to the register for an input command. Then, the command log register 3220 will sequentially store commands input to the command/address CA line.

In this embodiment, the memory device 3200 includes a reset detector 3280 that detects a reset signal/RESET and generates a command log read signal (CMD log read). The reset detector 3280 monitors the state of the reset signal/RESET provided to the reset pin of the memory device 3200. The reset signal/RESET is a signal provided by the host 3100 to initialize the operation of the memory device 3200. The reset signal/RESET may be activated by the host 3100 during an operation such as a power-on reset (POR) for initialization when the memory device 3200 is booted or an error occurs.

When the command log read signal CMD Log read is generated by the reset detector 3280, the command log register 3220 outputs the command log and the selection signal SEL to the data selector 3250. Then, the data selector 3250 will select the command log rather than the core data Core Data and output it to the DQ pin or the RFU pin. In this case, the output of the command log must be completed before initialization of the memory device 3200 by the reset signal/RESET starts. Otherwise, core data may be selected by the data selector 3250. The core data reaches the data selector 3250 through a flip-flop 3254.

The mode register set 3230 sets internal mode registers in response to an MRS command and an address ADDR for designating an operation mode of the memory device 3200. Although the register enable signal REG_En is generated in the mode register set 3230, a signal for outputting the command log of the command log register 3220 will not be generated. This is because the output of the command log of the command log register 3220 is triggered by the reset signal/RESET.

The memory device 3200 described above may automatically output the command log to the DQ pin or the RFU pin in response to the reset signal/RESET. This makes it possible to easily obtain a command log CMD Log from the memory device 3200 without a separate command or control means. Therefore, debugging can be easily performed in a memory system such as a high-bandwidth memory (HBM) or a system-in-package (SiP) with a high probing cost.

Figure 15:
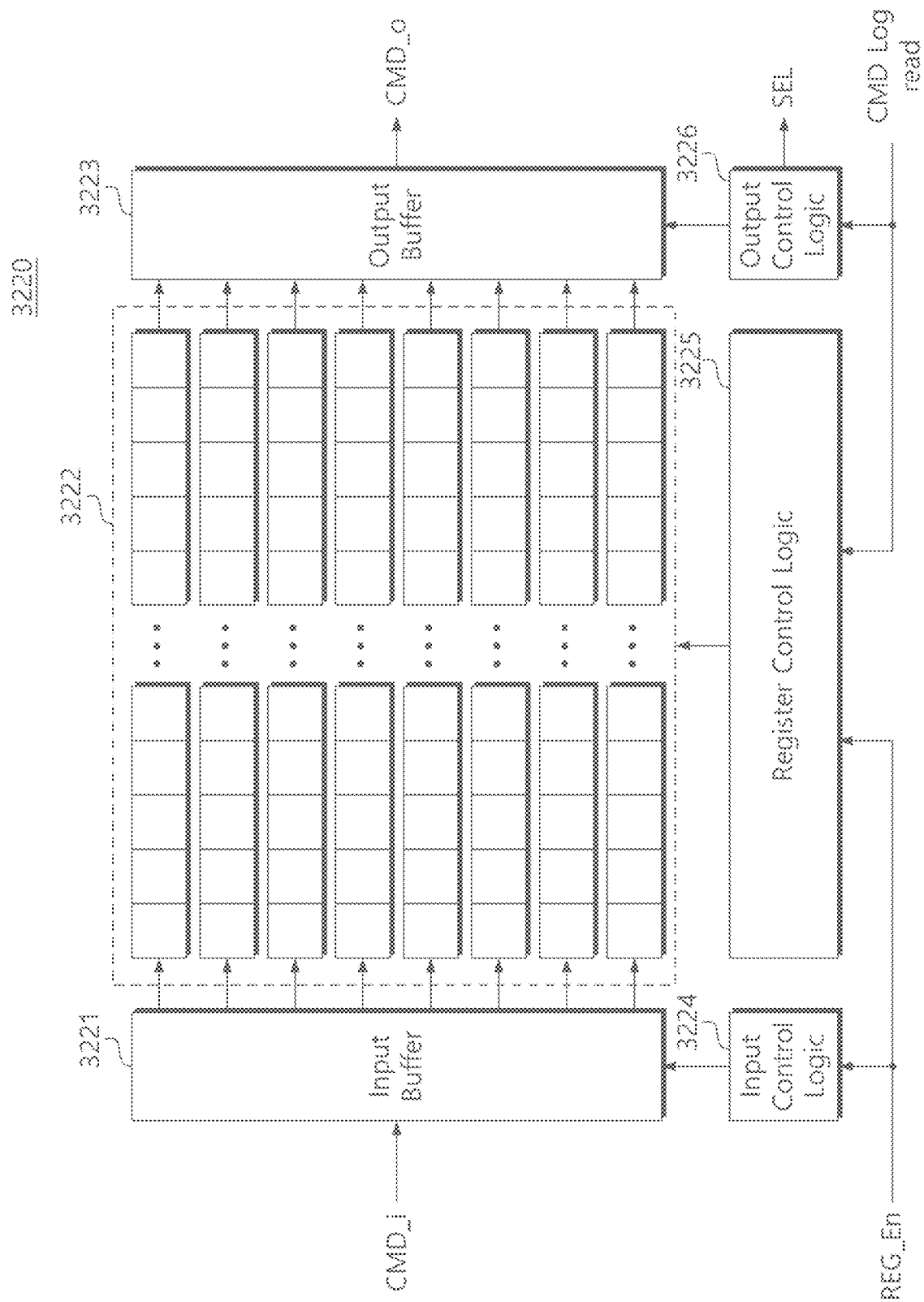
FIG. 15 is a block diagram showing the configuration of the command log register of FIG. 14.

FIG. 15 is a block diagram showing the command log register of FIG. 14. Referring to FIG. 15, the command log register 3220 includes an input buffer 3221, a register unit 3222, an output buffer 3223, an input control logic 3224, a register control logic 3225, and an output control logic 3226. Here, the input control logic 3224, the register control logic 3225, and the output control logic 3226 may be combined into one control logic.

Operations of the input buffer 3221, the register unit 3222, the output buffer 3223, and the input control logic 3224 are substantially the same as those of FIG. 4A. On the other hand, the register control logic 3225 and the output control logic 3226 control the register unit 3222 and the output buffer 3223 to output the command log in response to the command log read signal (CMD Log read), respectively. In addition, the output control logic 3226 transmits the selection signal SEL to the data selector (3250, refer to FIG. 14) in response to the command log read signal (CMD Log read).

The configuration of the command log register 3220 according to the above-described embodiment can be implemented in various ways. That is, the number of storable commands may be increased by adding an encoder to the front end of the input buffer 3221 or adding a decoder to the rear end of the output buffer 3223. In addition, it will be well understood that the number of commands that can be stored in the command log register 3220 may be variously adjusted according to the number of registers constituting the register unit 3222.

Figure 16:
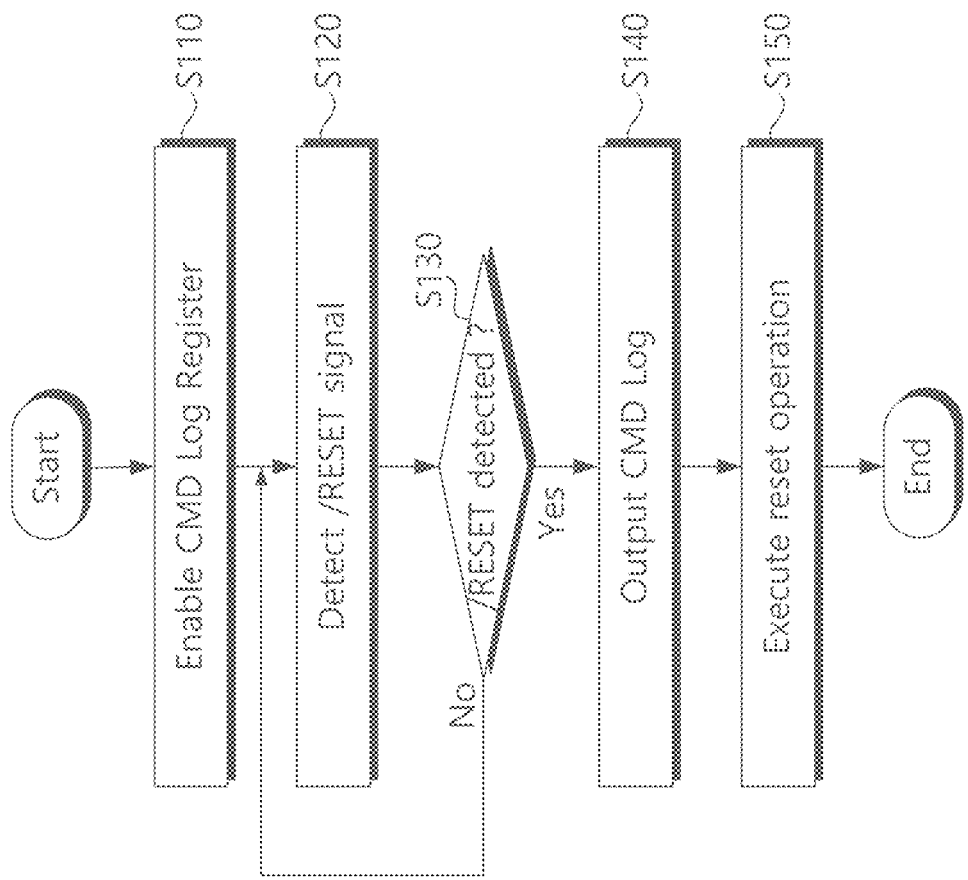
FIG. 16 is a flowchart illustrating a method of outputting a command log of the memory device of FIG. 14 according to an embodiment.

FIG. 16 is a flowchart illustrating a method of outputting a command log of the memory device of FIG. 14. Referring to FIG. 16, the memory device 3200 automatically outputs a command log CMD Log_in response to a reset signal/ RESET and then performs a memory reset operation.

In step S110, the memory device 3200 activates a command log operation of the command log register 3220. This is possible according to the activation of the register enable signal REG_En. Activation of the register enable signal REG_En may be enabled as a default or may be controlled by the host 3100 through an MRS command.

In step S120, the memory device 3200 monitors and detects an input of the reset signal/RESET. For example, the reset detector 3280 of FIG. 14 may detect whether a reset signal/RESET is input from the host 3100 through a reset pin. The reset signal/RESET may be input for initialization of the memory device 3200 during booting or when an error occurs. However, the memory device 3200 must output a command log CMD Log stored in the command log register 3220 before reset or initialization is performed.

In step S130, the operation branches according to whether the reset signal /RESET is detected by the reset detector 3280. If the reset signal/RESET is detected (Yes direction), the procedure moves to step S140 for outputting a command log CMD Log before initialization of the memory device 3200. On the other hand, if the reset signal/RESET is not detected (No direction), the procedure returns to step S120 to continuously monitor the input of the reset signal/RESET.

In step S140, the memory device 3200 outputs the commands stored in the command log register 3220 to the outside of the memory device 3200. That is, the memory device 3200 may output the command log stored in the command log register 3220 to the DQ pin or the RFU pin before performing device initialization.

In step S150, the memory device 3200 performs a reset operation for initializing the memory device 3200 after outputting the command log is completed.

As described above, the operation of the memory device 3200 for outputting the command log in response to the reset signal/RESET has been briefly described. Here, although the embodiment has been described in which the command log is output in response to the reset signal/RESET, embodiments are not limited thereto. The memory device 3200 may output a command log CMD Log_in response to a control signal other than the reset signal/RESET.

Figure 17:
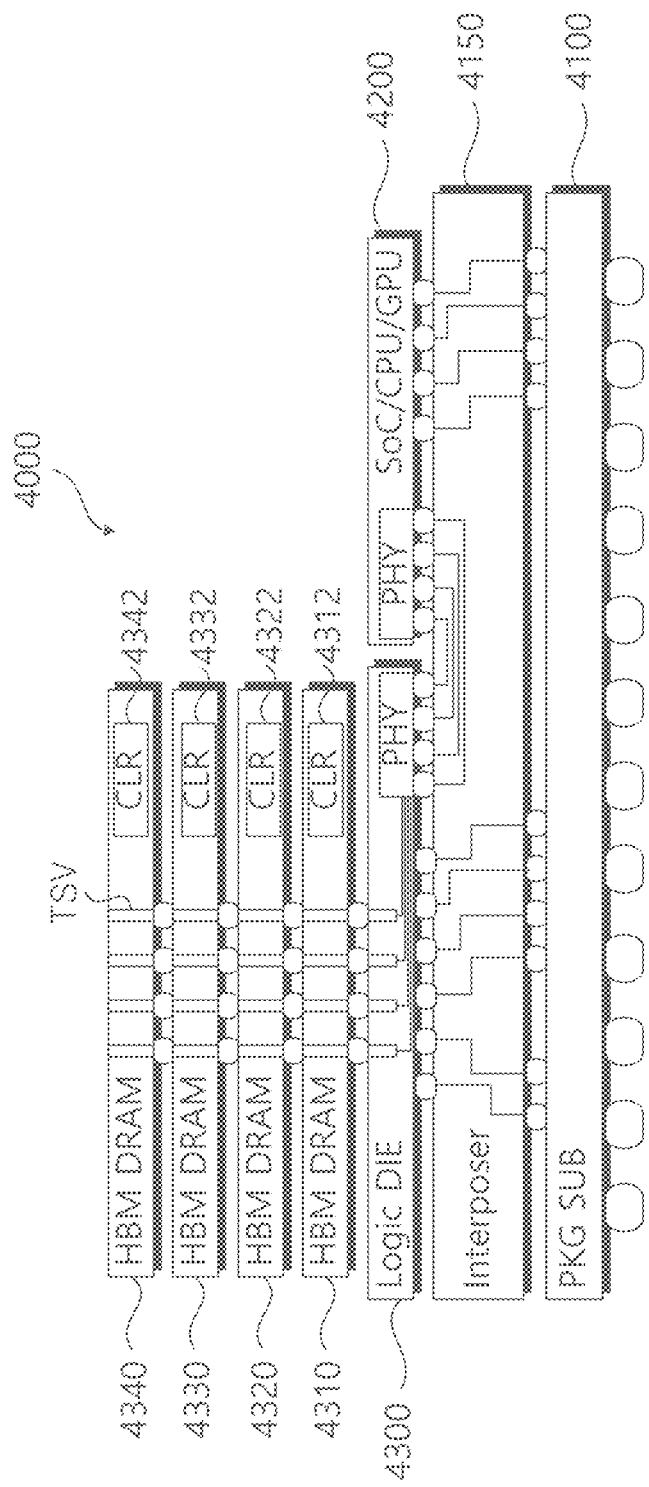
FIG. 17 is a cross-sectional view illustrating a memory system according to an embodiment.

FIG. 17 is a cross-sectional view illustrating a memory system according to an embodiment. Referring to FIG. 17, a memory system 4000 implemented as a stacked memory includes a PCB substrate 4100, an interposer 4150, a host die 4200, a logic die 4300, and HBMs (4310 and 4320, 4330, 4340).

The memory system 1000 connects the HBMs 4310, 4320, 4330, and 4340 to the host die 4200 using the interposer 1150. The interposer 1150 is disposed on the PCB 1100 and is electrically connected to the PCB 4100 through flip-chip bumps FB.

A host die 4200, a logic die 4300, and stacked HBMs 4310, 4320, 4330, and 4340 may be disposed on the interposer 4150. TSV lines are formed in the plurality of HBMs 4310, 4320, 4330, and 4340 to implement the memory system. The TSV lines may be electrically connected to the micro bumps MB formed between the plurality of HBMs 4310, 4320, 4330, and 4340.

Here, the plurality of HBMs 4310, 4320, 4330, and 4340 may include command log registers 4312, 4322, 4332, 4342 for storing command logs, respectively. Accordingly, there may exist a case in which the request from the host die 4200 is not valid or the command execution fails due to an internal operation problem of the HBMs 4310, 4320, 4330, and 4340. In this case, the command log stored in one of the command log registers 4312, 4322, 4332, and 4342 may be output to determine the cause of the command execution failure without probing or use of a logic analyzer. Therefore, low-cost and high-reliability debugging is possible in memory systems such as high-bandwidth memory (HBM) or system-in-package (SiP) with high probing costs.

While embodiments have been described with reference to the drawings, it will be apparent to those of ordinary skill in the art that various changes and modifications may be made thereto without departing from the spirit and scope of the present disclosure as set forth in the following claims.

What is claimed is:

1. A semiconductor memory device comprising:
   a memory core comprising memory cells and configured to output core data stored in the memory cells in response to a read request;
   a command decoder configured to decode at least one command input from an external device;
   a command log register configured to sequentially store the at least one command in response to a register enable signal and output the at least one command as a command log in response to a command log read signal; and
   a mode register set configured to generate the register enable signal or the command log read signal in response to a mode register set command transmitted to the command decoder.

2. The semiconductor memory device of claim 1, further comprising:
   a command gate configured to input the at least one command to the command log register in response to the register enable signal.

3. The semiconductor memory device of claim 1, further comprising:
   a data selector configured to select one of the core data output from the memory core and the command log output from the command log register and output the selected one of the core data and the command log to a data line.

4. The semiconductor memory device of claim 3, wherein the command log register is configured to provide a selection signal to the data selector in response to the command log read signal, and
   the data selector is further configured to select the one of the core data and the command log in response to the selection signal.

5. The semiconductor memory device of claim 4, further comprising:
   a variable delay line configured to set a latency of the command log output from the command log register.

6. The semiconductor memory device of claim 5, wherein the variable delay line comprises a plurality of delay elements selected according to a switch control signal generated by the mode register set command or a test mode register set command, wherein the latency of the command log provided by the plurality of delay elements is set to correspond to a read latency of the core data.

7. The semiconductor memory device of claim 1, wherein the command log register comprises an encoder configured to compress the at least one command.

8. The semiconductor memory device of claim 7, wherein the command log register comprises a decoder configured to decode the at least one compressed command.

9. The semiconductor memory device of claim 1, wherein the command log register is configured to output the command log through a Reserved Future Use (RFU) pin.

10. The semiconductor memory device of claim 1, further comprising:
a reset detector configured to detect a reset signal and generate the command log read signal in response to the reset signal.

11. A semiconductor memory device comprising:
a memory core comprising dynamic random access memory (DRAM) cells and configured to output core data stored in the DRAM cells in response to a read command;
a command decoder configured to decode at least one command input from an external device;
a command log register configured to sequentially store the at least one command in response to a register enable signal and output the at least one command as a command log in response to a command log read signal;
a command gate configured to transfer the at least one command to the command log register in response to the register enable signal;
a mode register set configured to generate the register enable signal in response to a mode register set command transmitted to the command decoder; and
a data selector configured to select one of the core data and the command log in response to a selection signal and output the selected one to a data pin.

12. The semiconductor memory device of claim 11, wherein the command log read signal is provided from the mode register set or a test mode register set.

13. The semiconductor memory device of claim 11, further comprising:
a reset detector configured to detect a reset signal,
wherein the command log read signal is triggered by the reset detector in response to the reset signal.

14. The semiconductor memory device of claim 11, wherein the selection signal is generated by the command log register.

15. The semiconductor memory device of claim 11, further comprising:
a variable delay line configured to adjust a first output latency of the command log output from the command log register with reference to a second output latency of the core data.

16. The semiconductor memory device of claim 11, wherein the command log register includes an encoder configured to compress the at least one command and store the at least one compressed command.

17. The semiconductor memory device of claim 16, wherein the command log register comprises a decoder configured to decode the at least one compressed command and output the decoded command.

18. A method for outputting a command log of a semiconductor memory device, the method comprising:
storing at least one command input from an external device into a command log register of the semiconductor memory device;
detecting a reset signal for initializing the semiconductor memory device;
outputting the at least one command stored in the command log register as a command log in response to the reset signal; and
initializing the semiconductor memory device after outputting the command log is completed.

19. The method of claim 18, wherein in the storing the at least one command, the command log register is activated through a mode register set command.

20. The method of claim 18, wherein the command log is output through a DQ pin or a Reserved Future Use (RFU) pin.

* * * * *